(12) United States Patent
Booth, Jr. et al.

(10) Patent No.: US 7,825,479 B2
(45) Date of Patent: Nov. 2, 2010

(54) ELECTRICAL ANTIFUSE HAVING A MULTI-THICKNESS DIELECTRIC LAYER

(75) Inventors: Roger A. Booth, Jr., Wappingers Falls, NY (US); Kangguo Cheng, Guilderland, NY (US); Chandrasekharan Kothandaraman, Hopewell Junction, NY (US); Chengwen Pei, Danbury, CT (US); Ravi M. Todi, Poughkeepsie, NY (US); Xiaojun Yu, Beacon, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/187,003

(22) Filed: Aug. 6, 2008

(65) Prior Publication Data

US 2010/0032732 A1 Feb. 11, 2010

(51) Int. Cl.
- *H01L 29/76* (2006.01)
- *H01L 29/94* (2006.01)
- *H01L 31/062* (2006.01)
- *H01L 31/113* (2006.01)
- *H01L 31/119* (2006.01)

(52) U.S. Cl. ...................... 257/395; 257/406
(58) Field of Classification Search ................ 257/395, 257/406, E29.264
See application file for complete search history.

(56) References Cited

U.S. PATENT DOCUMENTS

| | | | |
|---|---|---|---|
| 4,438,448 A * | 3/1984 | Harrington et al. | 257/331 |
| 4,823,175 A * | 4/1989 | Fontana | 257/321 |
| 5,208,177 A | 5/1993 | Lee | |
| 5,327,024 A | 7/1994 | Cox | |
| 5,422,505 A * | 6/1995 | Shirai | 257/327 |
| 5,469,077 A | 11/1995 | Cox | |
| 5,544,070 A | 8/1996 | Cox et al. | |
| 5,661,412 A | 8/1997 | Chawla et al. | |
| 5,668,751 A | 9/1997 | Sher et al. | |
| 5,684,317 A * | 11/1997 | Hwang | 257/316 |
| 5,726,484 A | 3/1998 | Hart et al. | |
| 5,815,429 A | 9/1998 | Sher et al. | |
| 5,831,923 A | 11/1998 | Casper | |
| 5,852,323 A | 12/1998 | Conn | |
| 5,937,281 A | 8/1999 | Wu | |
| 5,956,282 A | 9/1999 | Casper | |
| 5,965,270 A | 10/1999 | Fang et al. | |
| 5,970,372 A | 10/1999 | Hart et al. | |
| 6,108,260 A | 8/2000 | Casper | |
| 6,396,120 B1 | 5/2002 | Bertin et al. | |
| 6,438,065 B1 | 8/2002 | Rao et al. | |
| 6,737,312 B2 | 5/2004 | Moore | |
| 6,737,726 B2 | 5/2004 | Gilton | |
| 6,751,114 B2 | 6/2004 | Gilton et al. | |
| 6,784,018 B2 | 8/2004 | Campbell et al. | |
| 6,791,859 B2 | 9/2004 | Hush et al. | |

(Continued)

*Primary Examiner*—William M. Brewster
(74) *Attorney, Agent, or Firm*—Scully, Scott, Murphy & Presser, P.C.; Joseph P. Abate, Esq.

(57) ABSTRACT

An electrical antifuse comprising a field effect transistor includes a gate dielectric having two gate dielectric portions. Upon application of electric field across the gate dielectric, the magnitude of the electrical field is locally enhanced at the boundary between the thick and thin gate dielectric portions due to the geometry, thereby allowing programming of the electrical antifuse at a lower supply voltage between the two electrodes, i.e., the body and the gate electrode of the transistor, across the gate dielectric.

12 Claims, 13 Drawing Sheets

U.S. PATENT DOCUMENTS

| | | | |
|---|---|---|---|
| 6,791,885 B2 | 9/2004 | Casper et al. |
| 6,800,504 B2 | 10/2004 | Li et al. |
| 6,809,362 B2 | 10/2004 | Gilton |
| 6,812,087 B2 | 11/2004 | Giltom et al. |
| 6,813,176 B2 | 11/2004 | Gilton et al. |
| 6,813,178 B2 | 11/2004 | Campbell et al. |
| 6,818,481 B2 | 11/2004 | Moore et al. |
| 6,825,135 B2 | 11/2004 | Li et al. |
| 6,833,559 B2 | 12/2004 | Moore |
| 6,838,307 B2 | 1/2005 | Gilton |
| 6,847,535 B2 | 1/2005 | Gilton et al. |
| 6,849,868 B2 | 2/2005 | Campbell |
| 6,853,049 B2 | 2/2005 | Herner |
| 6,855,975 B2 | 2/2005 | Gilton |
| 6,856,002 B2 | 2/2005 | Moore et al. |
| 6,858,465 B2 | 2/2005 | Li et al. |
| 6,858,482 B2 | 2/2005 | Gilton |
| 6,861,727 B2 | 3/2005 | Forbes et al. |
| 6,864,500 B2 | 3/2005 | Gilton |
| 6,864,521 B2 | 3/2005 | Moore et al. |
| 6,867,064 B2 | 3/2005 | Campbell et al. |
| 6,867,114 B2 | 3/2005 | Moore et al. |
| 6,867,996 B2 | 3/2005 | Campbell et al. |
| 6,873,538 B2 | 3/2005 | Hush |
| 6,878,569 B2 | 4/2005 | Li |
| 6,881,623 B2 | 4/2005 | Campbell et al. |
| 6,881,994 B2 | 4/2005 | Lee et al. |
| 6,882,578 B2 | 4/2005 | Moore et al. |
| 6,888,155 B2 | 5/2005 | Campbell |
| 6,888,750 B2 | 5/2005 | Walker et al. |
| 6,890,790 B2 | 5/2005 | Li et al. |
| 6,891,749 B2 | 5/2005 | Campbell et al. |
| 6,894,304 B2 | 5/2005 | Moore |
| 6,903,361 B2 | 6/2005 | Gilton |
| 6,908,808 B2 | 6/2005 | Gilton |
| 6,909,656 B2 | 6/2005 | Moore et al. |
| 6,930,909 B2 | 8/2005 | Moore et al. |
| 6,937,528 B2 | 8/2005 | Hush et al. |
| 6,946,347 B2 | 9/2005 | Gilton |
| 6,946,719 B2 | 9/2005 | Petti et al. |
| 6,949,402 B2 | 9/2005 | Moore et al. |
| 6,949,453 B2 | 9/2005 | Li |
| 6,951,805 B2 | 10/2005 | Moore |
| 6,953,720 B2 | 10/2005 | Moore et al. |
| 6,954,385 B2 | 10/2005 | Casper et al. |
| 6,955,940 B2 | 10/2005 | Campbell et al. |
| 6,956,772 B2 | 10/2005 | Forbes |
| 6,961,277 B2 | 11/2005 | Moore et al. |
| 6,974,965 B2 | 12/2005 | Li |
| 6,992,349 B2 | 1/2006 | Lee et al. |
| 6,998,697 B2 | 2/2006 | Campbell et al. |
| 7,002,833 B2 | 2/2006 | Hush et al. |
| 7,010,644 B2 | 3/2006 | Gilton |
| 7,050,327 B2 | 5/2006 | Campbell |
| 7,056,762 B2 | 6/2006 | Moore et al. |
| 7,061,004 B2 | 6/2006 | Campbell |
| 7,061,071 B2 | 6/2006 | Gilton |
| 7,067,348 B2 | 6/2006 | Campbell et al. |
| 7,071,021 B2 | 7/2006 | Harshfield et al. |
| 7,087,454 B2 | 8/2006 | Campbell et al. |
| 7,087,919 B2 | 8/2006 | Campbell et al. |
| 7,094,700 B2 | 8/2006 | Li et al. |
| 7,098,068 B2 | 8/2006 | Brooks |
| 7,102,150 B2 | 9/2006 | Harshfield et al. |
| 7,112,484 B2 | 9/2006 | Gilton |
| 7,115,493 B2 | 10/2006 | Forbes et al. |
| 7,115,504 B2 | 10/2006 | Moore et al. |
| 7,115,992 B2 | 10/2006 | Moore et al. |
| 7,126,179 B2 | 10/2006 | Li et al. |
| 7,129,538 B2 | 10/2006 | Lee et al. |
| 7,132,325 B2 | 11/2006 | Abadeer et al. |
| 7,132,348 B2 | 11/2006 | Geusic et al. |
| 7,132,675 B2 | 11/2006 | Gilton |
| 7,151,273 B2 | 12/2006 | Campbell et al. |
| 7,151,688 B2 | 12/2006 | Williford et al. |
| 7,163,837 B2 | 1/2007 | Moore et al. |
| 7,177,193 B2 | 2/2007 | Forbes |
| 7,190,048 B2 | 3/2007 | Campbell |
| 7,190,608 B2 | 3/2007 | Williford et al. |
| 7,199,444 B2 | 4/2007 | Moore et al. |
| 7,202,104 B2 | 4/2007 | Li et al. |
| 7,202,520 B2 | 4/2007 | Gilton |
| 7,209,378 B2 | 4/2007 | Nejad et al. |
| 7,223,627 B2 | 5/2007 | Moore et al. |
| 7,224,632 B2 | 5/2007 | Moore et al. |
| 7,233,520 B2 | 6/2007 | Daley |
| 7,235,419 B2 | 6/2007 | Harshfield et al. |
| 7,242,603 B2 | 7/2007 | Hush et al. |
| 7,250,646 B2 | 7/2007 | Walker et al. |
| 7,251,154 B2 | 7/2007 | Hush |
| 7,256,471 B2 | 8/2007 | Min et al. |
| 7,269,044 B2 | 9/2007 | Daley |
| 7,269,079 B2 | 9/2007 | Hardy et al. |
| 7,274,034 B2 | 9/2007 | Campbell et al. |
| 7,276,722 B2 | 10/2007 | Gilton |
| 7,277,313 B2 | 10/2007 | Campbell et al. |
| 7,277,347 B2 | 10/2007 | Jenne |
| 7,289,349 B2 | 10/2007 | Campbell et al. |
| 7,294,527 B2 | 11/2007 | Campbell et al. |
| 7,304,368 B2 | 12/2007 | Campbell |
| 7,307,908 B2 | 12/2007 | Gilton |
| 7,315,465 B2 | 1/2008 | Campbell et al. |
| 7,317,200 B2 | 1/2008 | Campbell |
| 7,317,567 B2 | 1/2008 | Campbell |
| 7,326,950 B2 | 2/2008 | Campbell |
| 7,329,558 B2 | 2/2008 | Campbell |
| 7,329,565 B2 | 2/2008 | Herner |
| 7,332,735 B2 | 2/2008 | Campbell |
| 7,348,247 B2 * | 3/2008 | Park | 438/299 |
| 7,402,855 B2 * | 7/2008 | Kurjanowicz | 257/288 |
| 2001/0033000 A1 * | 10/2001 | Mistry | 257/339 |
| 2001/0040269 A1 | 11/2001 | Cutter et al. |
| 2002/0003264 A1 * | 1/2002 | Chan et al. | 257/368 |
| 2002/0050625 A1 | 5/2002 | Cutter et al. |
| 2007/0069259 A1 * | 3/2007 | Jeon | 257/291 |
| 2008/0026519 A1 * | 1/2008 | Liu et al. | 438/197 |

* cited by examiner

ELECTRICAL ANTIFUSE HAVING A MULTI-THICKNESS DIELECTRIC LAYER

FIELD OF THE INVENTION

The present invention relates to semiconductor structures, and particularly to electrical antifuses having two adjoined gate dielectric portions of different thicknesses to induce enhanced electrical field and a lower breakdown voltage, methods of manufacturing the same, and methods of programming the same.

BACKGROUND OF THE INVENTION

Electrical fuses and electrical antifuses are used in the semiconductor industry to implement array redundancy, field programmable arrays, analog component trimming circuits, and chip identification circuits. Once programmed, the programmed state of an electrical fuse or an electrical antifuse does not revert to the original state on its own, that is, the programmed state of the fuse is not reversible. For this reason, electrical fuses and electrical antifuses are called One-Time-Programmable (OTP) memory elements.

Programming or lack of programming constitutes one bit of stored information in fuses or antifuses. The difference between fuses and antifuses is the way the resistance of the memory element is changed during the programming process. Semiconductor fuses have a low initial resistance state that may be changed to a higher resistance state through programming, i.e., through electrical bias conditions applied to the fuse. In contrast, semiconductor antifuses have a high initial resistance state that may be changed to a low resistance state through programming.

One type of electrical antifuse operates by breakdown of a dielectric layer upon application of sufficient electric field across two conductors. In an intact, or unprogrammed, antifuse, the integrity of the dielectric layer is preserved, thereby maintaining a high resistance state of the electrical antifuse. To program the electrical antifuse, a high electrical field is applied across the dielectric layer to induce a rupture, thereby causing reduction of resistance across the two electrodes of the electrical antifuse located on opposite sides of the dielectric layer. By detecting the resistance across the dielectric layer, the state of the antifuse may be determined. The resistance value across the two electrodes of the electrical antifuse encodes the "on" or "off" state of the electrical antifuse.

A typical electrical antifuse employs a gate dielectric for the dielectric layer between the two electrodes. The resistance across the two electrodes of an electrical antifuse before programming, or "breakdown," is typically greater than 1 GΩ. The resistance across the two electrodes of an electrical antifuse after programming, that is, after the breakdown of the dielectric layer between the two electrodes is induced, is typically less than 1 MΩ. A sensing circuit is provided to allow decoding of the information stored in the electrical antifuse. Typically, an electrostatic discharge (ESD) protection circuit is also provided to prevent accidental programming and to enhance the reliability of the electrical antifuse thereby.

One of the challenges in implementing electrical antifuse devices is the high electrical field required to induce breakdown of a dielectric layer between two conductive electrodes. Since the thickness of a silicon oxide based gate dielectric is greater than 1 nm due to limitations on tunneling current, any electrical antifuse employing the gate dielectric as the dielectric layer between two electrodes needs a voltage supply that may generate high enough electrical field to induce dielectric breakdown across the gate dielectric. For this reason, electrical antifuses employing a silicon oxide based gate dielectric typically require several volts, and at least a few volts to induce dielectric breakdown for programming.

Constant scaling of semiconductor devices and development of low power applications have reduced power supply voltage for semiconductor chips. Semiconductor chips having a power supply voltage less than 2.0 volts are routinely manufactured in the semiconductor industry. Generation of an internal high voltage supply circuit takes up space in a semiconductor chip, as well as consuming power. At the same time, programmable memories are needed to encode information in semiconductor chips.

In view of the above, there exists a need for an electrical antifuse structure that may be programmed at a lower power supply voltage in a reliable manner, and methods of manufacturing the same.

SUMMARY OF THE INVENTION

The present invention addresses the needs described above by providing electrical antifuses having a gate dielectric in which two gate dielectric portions having different thicknesses are joined to induce enhanced electrical field, thereby enabling a lower breakdown voltage for the electrical antifuses, and methods of manufacturing the same.

In the present invention, a thick gate dielectric layer is formed in an active area of a semiconductor substrate. The thick gate dielectric layer is lithographically patterned to expose a semiconductor surface, which is thermally converted to a thin gate dielectric portion abutting a thick gate dielectric portion. A gate conductor that is subsequently formed overlies the boundary between the thin gate dielectric portion and the thick gate dielectric portion. An electrical antifuse comprising a field effect transistor includes a gate dielectric having two gate dielectric portions. Upon application of electric field across the gate dielectric, the magnitude of the electrical field is locally enhanced at the boundary between the thick and thin gate dielectric portions due to the geometry, thereby allowing programming of the electrical antifuse at a lower supply voltage between the two electrodes, i.e., the body and the gate electrode of the transistor, across the gate dielectric.

According to an aspect of the present invention, a semiconductor structure is provided, which comprises:

a gate dielectric located on a semiconductor layer and comprising a first gate dielectric portion having a first thickness and a second gate dielectric having a second thickness and abutting the first gate dielectric portion, wherein the first thickness is greater than the second thickness; and a gate electrode vertically abutting a first top surface of the first gate dielectric portion and a second top surface of the second gate dielectric portion.

In one embodiment, the gate electrode comprises a sidewall directly adjoining the first top surface of the first gate dielectric portion and another sidewall directly adjoining the second top surface of the second gate dielectric portion.

In another embodiment, the gate dielectric further comprises a third gate dielectric portion having the first thickness and abutting the second gate dielectric portion and not abutting the first gate dielectric portion.

In yet another embodiment, a first bottom surface of the first gate dielectric portion is vertically offset from a second bottom portion of the second gate dielectric portion.

According to another aspect of the present invention, a method of forming a semiconductor structure is provided, which comprises:

forming a gate dielectric layer having a first thickness on a semiconductor substrate;

patterning the gate dielectric layer to form a first gate dielectric portion, wherein a semiconductor surface is exposed underneath a removed portion of the gate dielectric layer;

forming a second gate dielectric portion having a second thickness directly on the semiconductor surface, wherein the second gate dielectric portion abuts the first gate dielectric portion; and forming a gate electrode directly on a first top surface of the first gate dielectric portion and a second top surface of the second gate dielectric portion.

In one embodiment, the method further comprises:

applying a photoresist directly on the gate dielectric layer;

lithographically patterning the photoresist to expose a portion of the gate dielectric layer; and etching the gate dielectric layer employing the photoresist as an etch mask, wherein a remaining portion of the gate dielectric layer underneath the photoresist constitutes the first gate dielectric portion.

According to yet another aspect of the present invention, a method of programming an electrical antifuse is provided, which comprises:

providing an electrical antifuse comprising:

a gate dielectric located on a semiconductor layer and comprising a first gate dielectric portion having a first thickness and a second gate dielectric having a second thickness and abutting the first gate dielectric portion, wherein the first thickness is greater than the second thickness; and a gate electrode vertically abutting a first top surface of the first gate dielectric portion and a second top surface of the second gate dielectric portion; and inducing a rupture in the gate dielectric by applying a voltage bias across the gate electrode and the semiconductor layer.

In one embodiment, the gate electrode is ruptured at a boundary between the first gate dielectric portion and the second gate dielectric portion.

BRIEF DESCRIPTION OF THE DRAWINGS

FIGS. 1A-5B are sequential views of a first exemplary semiconductor structure according to a first embodiment of the present invention during various stages of manufacturing. Figures with the same numeric label correspond to the same stage of manufacturing. Figures with the suffix "A" are top-down views, and figures with the suffix "B" are vertical cross-sectional views along the plane B-B' of the corresponding figure with the same numeric label and the suffix "A." A middle-of-line (MOL) insulator layer is omitted in FIGS. 5A and 5B for clarity.

FIGS. 1A and 1B correspond to a step after formation of a gate dielectric layer 32L. FIGS. 5A and 5B correspond to a step after formation of a source contact via 82, a drain contact via 84, and a gate contact via 86.

FIGS. 6A-9B are sequential views of a second exemplary semiconductor structure according to a second embodiment of the present invention during various stages of manufacturing. Figures with the same numeric label correspond to the same stage of manufacturing. Figures with the suffix "A" are top-down views, and figures with the suffix "B" are vertical cross-sectional views along the plane B-B' of the corresponding figure with the same numeric label and the suffix "A." A middle-of-line (MOL) insulator layer is omitted in FIGS. 9A and 9B for clarity.

FIGS. 6A and 6B correspond to a step of formation of a first gate dielectric portion 32. FIGS. 8 and 8B correspond to as step after formation of a gate electrode 42 and a first gate spacer 42. FIGS. 9A and 9B correspond to a step after formation of a source contact via 82, a drain contact via 84, and a gate contact via 86.

FIGS. 10A-13B are sequential views of a third exemplary semiconductor structure according to a third embodiment of the present invention during various stages of manufacturing. Figures with the same numeric label correspond to the same stage of manufacturing. Figures with the suffix "A" are top-down views, and figures with the suffix "B" are vertical cross-sectional views along the plane B-B' of the corresponding figure with the same numeric label and the suffix "A." A middle-of-line (MOL) insulator layer is omitted in FIGS. 13A and 13B for clarity.

FIGS. 10A and 10B correspond to a step of formation of a first gate dielectric portion 32. FIGS. 12 and 12B correspond to as step after formation of a gate electrode 42 and a first gate spacer 42. FIGS. 13A and 13B correspond to a step after formation of a source contact via 82, a drain contact via 84, and a gate contact via 86.

DETAILED DESCRIPTION OF THE INVENTION

Figure 1A:
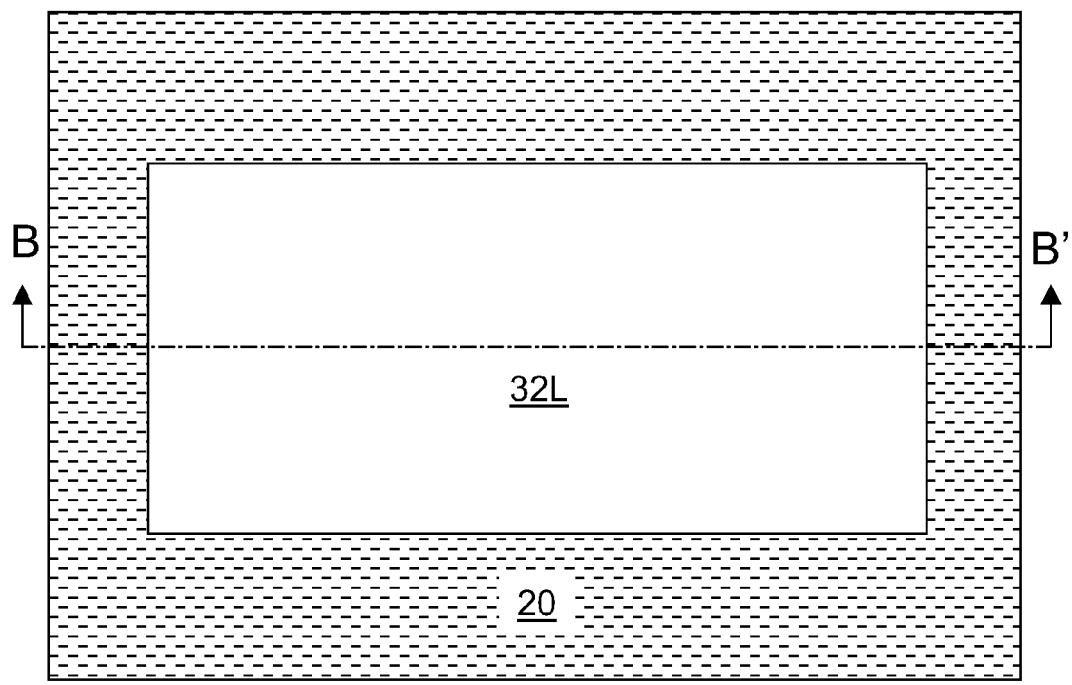

As stated above, the present invention relates to electrical antifuses having two adjoined gate dielectric portions of different thicknesses to induce enhanced electrical field and a lower breakdown voltage, methods of manufacturing the same, and methods of programming the same, which are now described in detail with accompanying figures. It is noted that like and corresponding elements mentioned herein and illustrated in the drawings are referred to by like reference numerals. As used herein, when introducing elements of the present invention or the preferred embodiments thereof, the articles "a", "an", "the" and "said" are intended to mean that there are one or more of the elements. Throughout the drawings, the same reference numerals or letters are used to designate like or equivalent elements. Detailed descriptions of known functions and constructions unnecessarily obscuring the subject matter of the present invention have been omitted for clarity. The drawings are not necessarily drawn to scale.

Figure 1B:
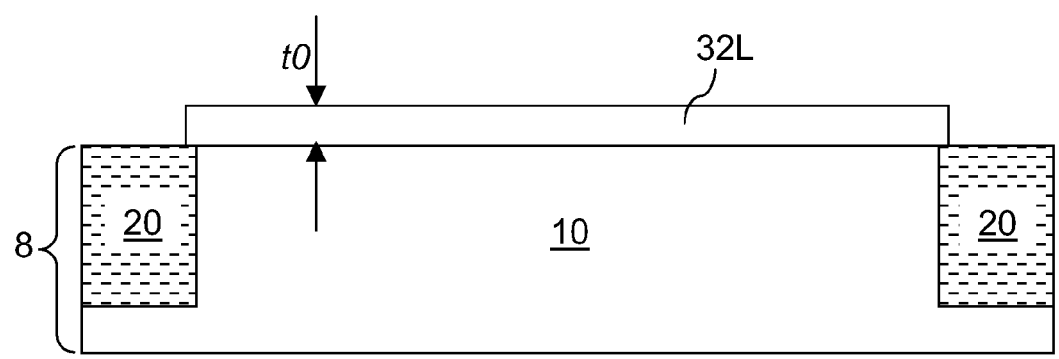

Referring to FIGS. 1A-1B, a first exemplary semiconductor structure according to a first embodiment of the present invention is shown. FIG. 1A is a top-down view. FIG. 1B is a vertical cross-sectional view along the plane B-B' shown in FIG. 1A.

The first exemplary semiconductor structure comprises a semiconductor substrate 8 that contains a semiconductor layer 10 and a shallow trench isolation structure 20. The semiconductor substrate may be a bulk substrate, a semiconductor-on-insulator (SOI) substrate, or a hybrid substrate having a bulk portion and an SOI portion. The semiconductor layer 10 comprises a semiconductor material such as silicon, a silicon containing alloy, a germanium containing alloy, a III-V compound semiconductor, or a II-IV semiconductor. Preferably, the semiconductor layer 10 is single crystalline. The semiconductor layer 10 has a p-type doping or an n-type doping. The dopant concentration of the semiconductor layer 10 may be from about $1.0\times10^{13}/cm^3$ to about $1.0\times10^{19}/cm^3$, and typically from about $1.0\times10^{16}/cm^3$ to about $1.0\times10^{18}/cm^3$, although lesser and greater concentrations are also contemplated herein. The semiconductor layer 10 may be single crystalline. Alternately, the semiconductor layer 10 may be polycrystalline.

The shallow trench isolation structure 20 comprises a dielectric material and provides electrical isolation between semiconductor devices formed on the semiconductor layer 10. The shallow trench isolation structure 20 laterally surrounds a portion of the semiconductor layer 10, which is herein referred to as an active area. A top surface of the active area is a portion of the top surface of the semiconductor substrate 8. The semiconductor substrate 8 may be a bulk substrate, a semiconductor-on-insulator (SOI) substrate, or a hybrid substrate including a bulk portion and a semiconductor-on-insulator (SOI) portion.

A gate dielectric layer 32L is formed on the top surface of the semiconductor layer 10. In one case, the gate dielectric layer 32L comprises a dielectric material formed by conversion of a semiconductor material in an exposed portion of the active area into a dielectric material by thermal oxidation, thermal nitridation, plasma oxidation, plasma nitridation, or a combination thereof. For example, the semiconductor layer 10 may comprise silicon and the gate dielectric layer 32L may comprise a silicon oxide based dielectric material formed by thermal conversion of silicon into a dielectric material. The silicon based dielectric material may be thermal silicon oxide or a thermal silicon oxynitride.

In another case, the gate dielectric layer 32L comprises a high dielectric constant (high-k) material. The high-k dielectric material comprises a dielectric metal oxide having a dielectric constant that is greater than the dielectric constant of silicon oxide of 3.9. Typically, the high-k dielectric material has a dielectric constant greater than 8.0. Non-limiting exemplary high-k dielectric materials include $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, a silicate thereof, and an alloy thereof. Each value of x is independently from about 0.5 to about 3 and each value of y is independently from 0 to about 2. The high-k dielectric material layer may be formed by methods well known in the art including, for example, a chemical vapor deposition (CVD), an atomic layer deposition (PVD), molecular beam epitaxy (MBE), pulsed laser deposition (PLD), liquid source misted chemical deposition (LSMCD), etc.

The thickness of the gate dielectric layer 32L is herein referred to as an initial dielectric thickness t0. In case the gate dielectric layer 32L is formed by conversion of a semiconductor material, the thickness of the gate dielectric layer 32L may be from about 2 nm to about 10 nm, and typically from about 3 nm to 7 nm, although lesser and greater thicknesses are also contemplated herein. In case the gate dielectric layer 32L comprises a high-k dielectric material, the thickness of the gate dielectric layer 32L may be from about 2 nm to about 10 nm.

Figure 2A:
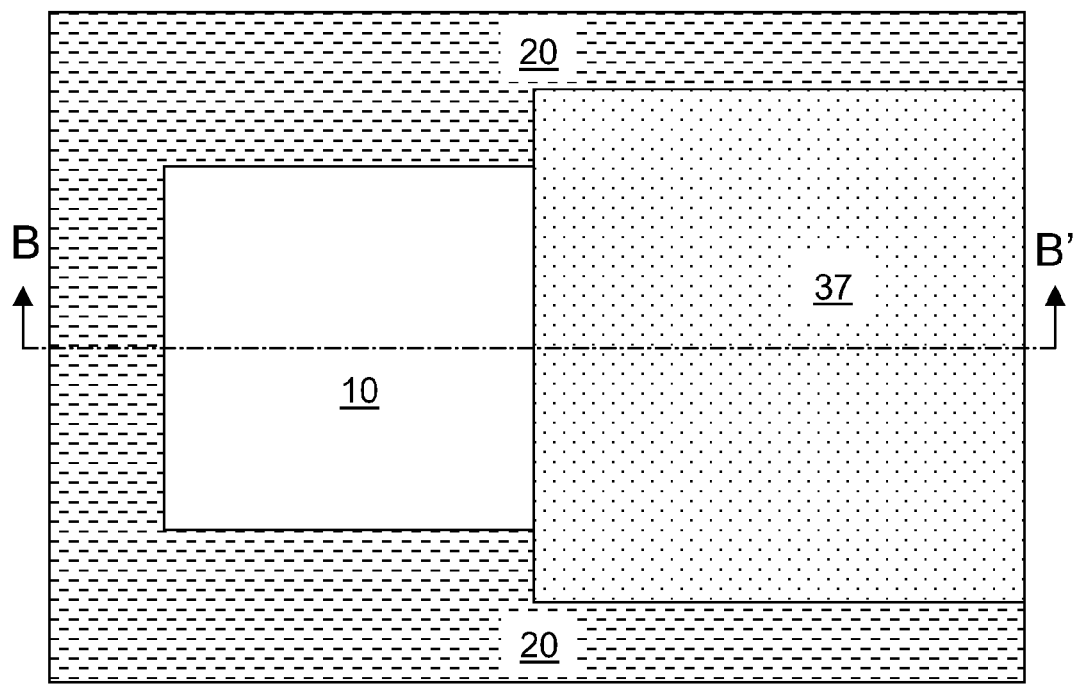
FIGS. 2A and 2B correspond to a step of formation of a first gate dielectric portion 32 by patterning the gate dielectric layer 32L.
Figure 2B:
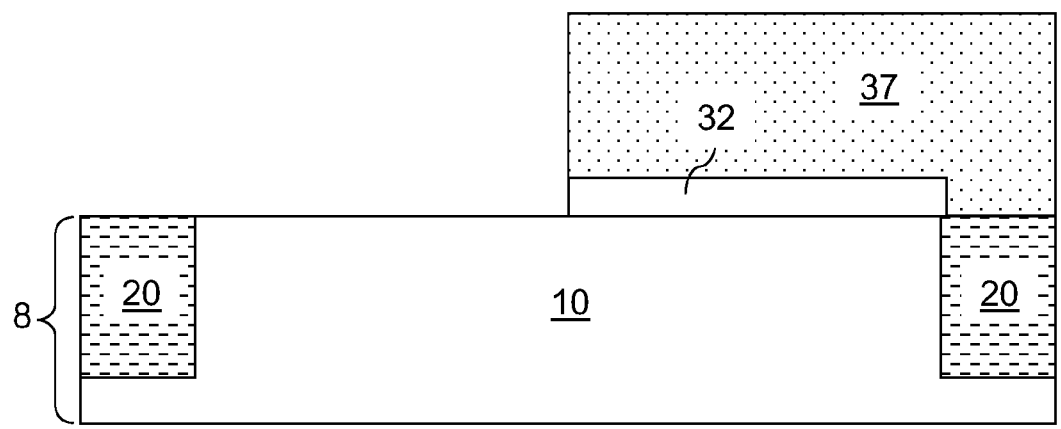

Referring to FIGS. 2A and 2B, a photoresist 37 is applied over the top surface of the gate dielectric layer 32L and lithographically patterned by exposure and development. The photoresist 37 may be a block level photoresist that typically employs mid-ultraviolet (MUV) lithography for exposure and development. Alternately, the photoresist 37 may be any other type of photoresist such as a deep-ultraviolet (DUV) photoresist, extreme-ultraviolet (EUV) photoresist, or electron beam resist. The edge of the photoresist 37 may be a straight line or a curved line.

Employing the remaining portion of the photoresist 37 as an etch mask, the exposed portion of the gate dielectric layer 32L is removed by an etch. The etch may be an anisotropic etch or an isotropic etch. The etch may be a dry etch such as a reactive ion etch or a wet etch. The remaining portion of the gate dielectric layer 32L is herein referred to as a first gate dielectric portion 32, which has the initial dielectric thickness t0. The top surface of the active area comprising the semiconductor material of the semiconductor layer 10 is exposed outside the area covered by the photoresist 37. The photoresist 37 is subsequently removed. A suitable cleaning process may be performed on the exposed surface of the semiconductor layer 10.

Figure 3A:
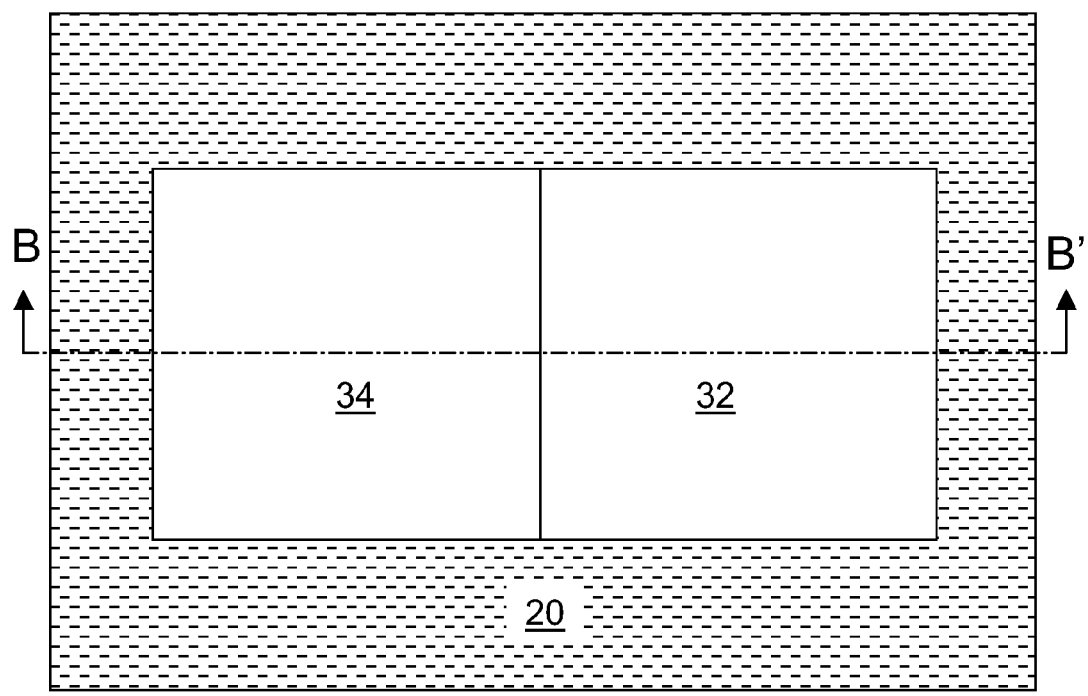
FIGS. 3A and 3B correspond to a step after formation of a second gate dielectric portion 34.
Figure 3B:
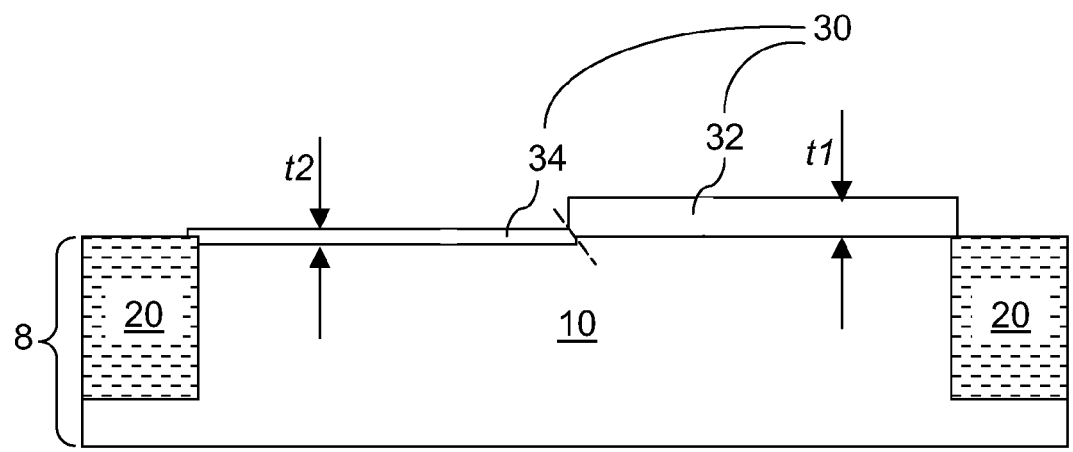

Referring to FIGS. 3A and 3B, a second gate dielectric portion 34 is formed on the exposed surface of the semiconductor layer 10. In one case, the second gate dielectric portion 34 is formed by conversion of the semiconductor material in the exposed portion of the active area into a dielectric material by thermal oxidation, thermal nitridation, plasma oxidation, plasma nitridation, or a combination thereof. For example, the semiconductor layer 10 may comprise silicon and the second gate dielectric portion 34 may comprise a silicon oxide based dielectric material formed by thermal conversion of silicon into a dielectric material. The silicon based dielectric material may be thermal silicon oxide or a thermal silicon oxynitride. Since the semiconductor material of the semiconductor layer 10 is consumed to form the second gate dielectric portion 34 in this case, the bottom surface of the second gate dielectric portion 34, which is herein referred to as a second bottom surface, is vertically offset from the bottom surface of the first gate dielectric portion 32, which is herein referred to as the first bottom surface.

In this case, the first gate dielectric portion 32 has a first thickness t1, which may be substantially the same as the initial dielectric thickness t0 if a thickness increase of the first gate dielectric portion 32 is negligible during the formation of the second gate dielectric portion 34, or may be greater than the initial dielectric thickness t0 if the thickness the first gate dielectric portion 32 increases during the formation of the second gate dielectric portion 34. The first thickness t1 may be from about 2 nm to about 12 nm, and typically from about 3 nm to 7 nm, although lesser and greater thicknesses are also contemplated herein.

In another case, the second gate dielectric portion 34 is formed by deposition of a high dielectric constant (high-k) material. The high-k dielectric material may comprise any material that may be employed for the gate dielectric layer 32 as described above. In this case, the second gate dielectric portion 34 consists of the high-k dielectric material. Since the high-k dielectric material is added to the first gate dielectric portion 32, the thickness of the first gate dielectric portion 32 increases from the initial dielectric thickness t0 by the thickness of the second gate dielectric portion 34. The first gate dielectric portion comprises the material of the gate dielectric layer 32L (See FIGS. 1A and 1B) and the material of the second gate dielectric portion 34. The first thickness t1 may be from about 2 nm to about 15 nm, and typically from about 3 nm to 10 nm, although lesser and greater thicknesses are also contemplated herein.

The second gate dielectric portion 34 has a second thickness t2, which is less than the first thickness t1. The second thickness t2 may be from about 1 nm to about 3 nm, although lesser and greater thicknesses are contemplated herein. In one case, the first bottom surface, which is the bottom surface of the first gate dielectric portion 32, may be vertically offset from, and located above the height of, the second bottom surface, which is the bottom surface of the second gate dielectric portion 34. In another case, the first bottom surface is substantially coplanar with the second bottom surface. The first gate dielectric portion 32 and the second gate dielectric portion 34 collectively constitute a gate dielectric 30. The second gate dielectric portion 34 laterally abuts, and is directly joined to, the first gate dielectric portion 32. The boundary between the second gate dielectric portion 34 and the first gate dielectric portion 32 may be a straight line or a curved line.

Figure 4A:
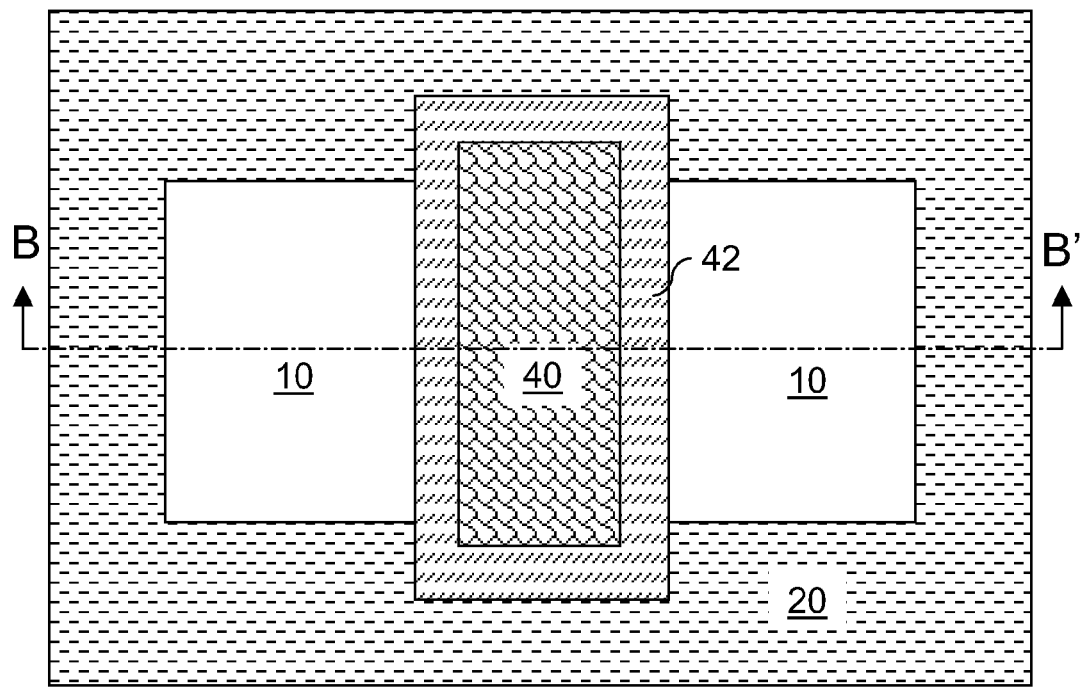
FIGS. 4A and 4B correspond to a step after formation of a gate electrode 42 and a first gate spacer 42.
Figure 4B:
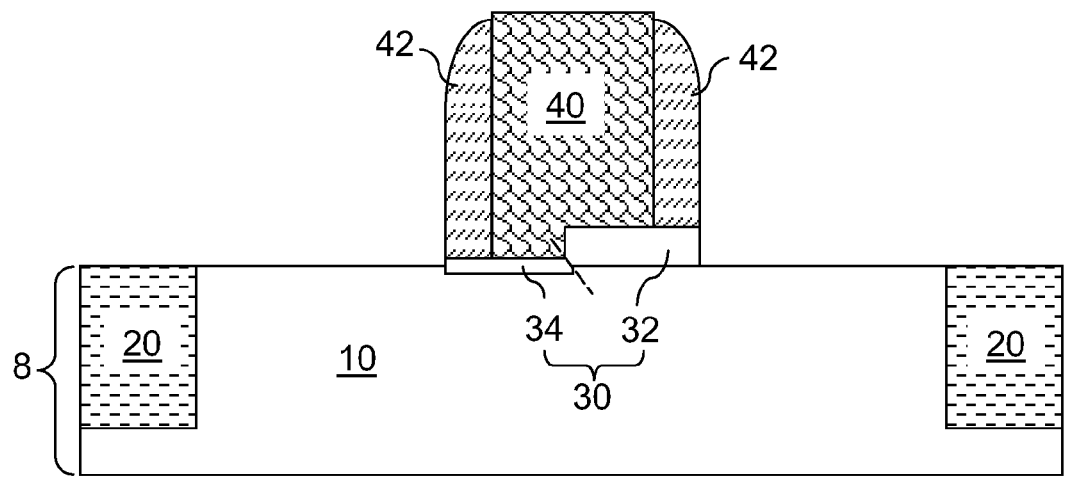

Referring to FIGS. 4A and 4B, a gate conductor layer (not shown) is formed over the gate dielectric 30. In one case, the gate conductor layer has a polycrystalline, microcrystalline, or amorphous structure and comprises a semiconductor layer including a semiconductor material such as silicon, a silicon containing alloy, a germanium containing alloy, a III-V compound semiconductor, or a II-IV semiconductor. The semiconductor layer may be doped with at least one electrical dopant such as boron, gallium, indium, phosphorus, arsenic, antimony, or a combination thereof The semiconductor layer may be formed by chemical vapor deposition (CVD) such as rapid thermal chemical vapor deposition (RTCVD), low pressure chemical vapor deposition (LPCVD), plasma enhanced chemical vapor deposition (PECVD). The semiconductor layer may have a thickness from about 30 nm to about 300 nm, and preferably from about 50 nm to about 200 nm, and even more preferably from about 80 nm to about 150 nm.

In another case, the gate conductor layer comprises a metal layer including a conductive metallic material, which may be a metal, a metal alloy, or a metal nitride. For example, the metal layer may comprise a material such as TaN, TiN, WN, TiAlN, TaCN, other conductive refractory metal nitrides, or an alloy thereof The conductive metallic material is also known as metal gate material in the art. The thickness of the metal layer may be from about 5 nm to about 40 nm, and preferably from about 7 nm to about 20 nm, although lesser and greater thicknesses are also contemplated herein. The metal layer may be formed, for example, by chemical vapor deposition (CVD), physical vapor deposition (PVD), atomic layer deposition (ALD), etc.

The gate conductor layer may comprise a semiconductor layer, a metal layer, a plurality of semiconductor layers, a plurality of metal layers, a stack of a semiconductor layer and a metal layer, or a combination thereof.

The gate conductor layer is lithographically patterned to form a gate electrode 40, which overlies the boundary between the first gate dielectric portion 32 and the second gate dielectric portion 34. An anisotropic etch that is employed to form the gate electrode 40 may, or may not, be selective to the gate dielectric 30. Since the gate electrode 40 straddles the boundary between the first gate dielectric portion 32 and the second gate dielectric portion 34, a sidewall of the gate electrode 40 is formed over the first gate dielectric portion 32 and another sidewall of the gate electrode 40 is formed over the second gate dielectric portion 34. A first gate spacer 42 comprising a dielectric material is formed on the sidewalls of the gate electrode 40. The first gate spacer 42 may laterally surround the gate electrode 40. The first gate spacer 42 may be formed by deposition of a conformal dielectric layer followed by an anisotropic etch that removes horizontal portions of the conformal dielectric layer. The anisotropic etch may, or may not, be selective to the gate dielectric 30. In case the anisotropic etch is not selective to the gate dielectric 30, exposed portions of the gate dielectric 30 is removed so that the outer edge of the gate dielectric 30 is substantially vertically coincident with the outer sidewalls of the first gate spacer 42.

Figure 5A:
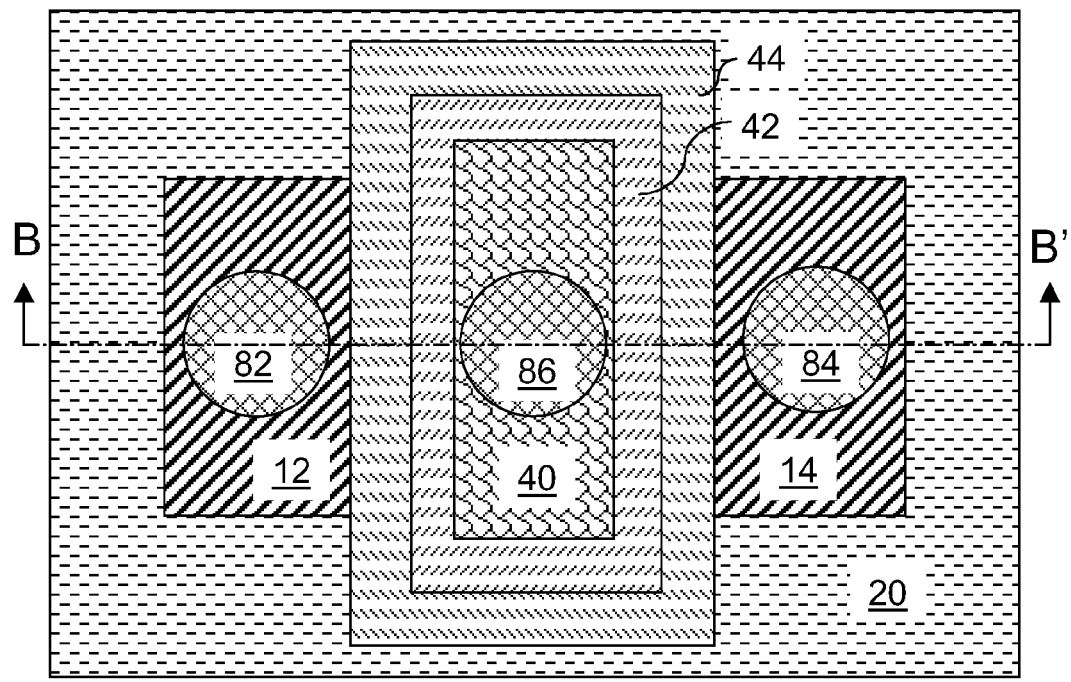
Figure 5B:
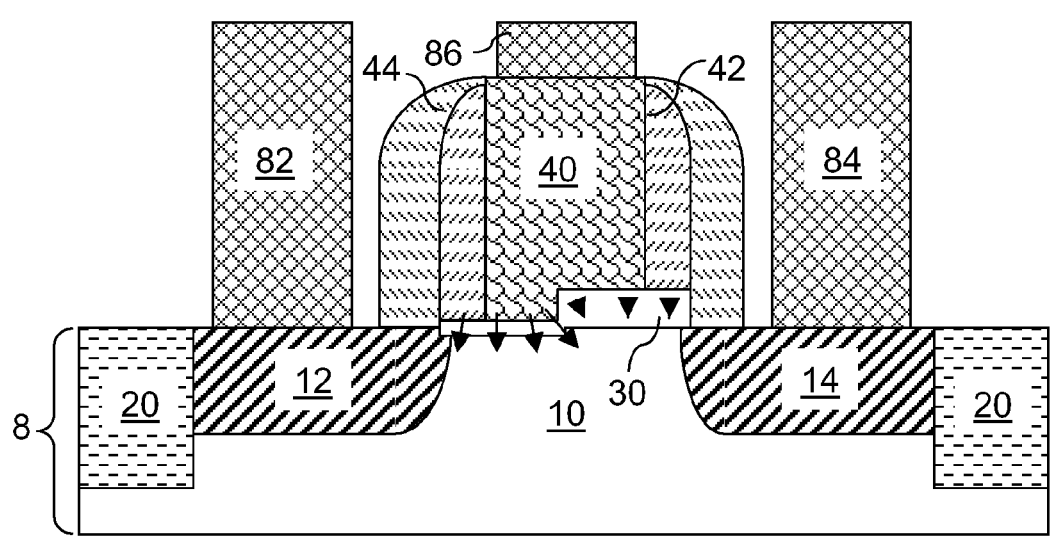

Referring to FIGS. 5A and 5B, a source region 12 and a drain region 14 are formed, for example, by ion implantation. A second gate spacer 44 comprising a dielectric material may be formed on the outer sidewalls of the first gate spacer 42. The second gate spacer 44 may laterally surround the first gate spacer 42 and the gate electrode 40. The source region 12, the drain region 14, the gate dielectric 30, the gate electrode 40, and a channel collectively constitute a field effect transistor. The channel is a portion of the semiconductor layer 10 that abuts the bottom surface, i.e., the first bottom surface and the second bottom surface, of the gate dielectric 30. The field effect transistor is also an electrical antifuse that may be programmed by inducing a dielectric breakdown of the gate dielectric 30 upon application of a voltage bias between the channel and the gate electrode 40.

Metal semiconductor alloys such as metal silicides may be formed on the source region 12, the drain region 14, and the gate conductor 40. A middle-of-line (MOL) dielectric layer (not shown) is formed over the semiconductor substrate 8, the gate electrode 40, the first gate spacer 42, and the gate spacer 44. The MOL dielectric layer may comprise, for example, a CVD oxide. The CVD oxide may be an undoped silicate glass (USG), borosilicate glass (BSG), phosphosilicate glass (PSG), fluorosilicate glass (FSG), borophosphosilicate glass (BPSG), or a combination thereof. The thickness of the MOL dielectric layer may be from about 200 nm to about 500 nm. Alternately, the MOL dielectric layer may comprise an organosilicate glass (OSG) having a dielectric constant value of less than 2.8. The MOL dielectric layer is preferably planarized, for example, by chemical mechanical polishing (CMP). Alternately, the MOL dielectric layer may be a self-planarizing material such as a spin-on glass (SOG) or a spin-on low-k dielectric material such as SiLK™.

Various contact via holes are formed in the MOL dielectric layer and filled with metal to from various contact vias. Specifically, a source contact via 82 is formed on the source region 12, a drain contact via 84 is formed on the drain region 14, and a gate contact via 86 is formed on the gate electrode 86. A first level metal wiring (not shown) may thereafter be formed, followed by formation of back-end-of-line (BEOL) structures.

The state of the electrical antifuse of the present invention may be detected by measuring the device characteristics of the field effect transistor. In an intact, or "unprogrammed" antifuse of the present invention, the device characteristics of the field effect transistor are normal, i.e., the unprogrammed antifuse operates as a functional transistor. The gate electrode 40 is electrically isolated from the source region 12 and the drain region 14, and the on-current of the field effect transistor shows dependency on the gate-to-source voltage and the drain-to-source voltage.

Once dielectric breakdown is induced in the gate dielectric 30, i.e., once the antifuse of the present invention is "programmed," the device characteristics of the electrical antifuse deviates from the device characteristics of a functional transistor due to the reduced resistance between the semiconductor substrate 10 and the gate electrode 40. The dielectric breakdown of the gate dielectric 30 causes the gate electrode 40 to be coupled to the channel of the field effect transistor.

The difference in the thickness of the first gate dielectric portion 32 and the thickness of the second gate dielectric portion 34 (See FIG. 4B) causes concentration of electric field at the boundary between the first gate dielectric portion 32 and the second gate dielectric portion 34. In general, the magnitude of the electrical field is enhanced at the corner of a conductive structure. The step between the first gate dielectric portion 32 and the second gate dielectric portion 34 in the gate dielectric 30, is necessarily accompanied by two corners of the gate conductor 40 that correspond to the bottom and the top of the step in the gate dielectric 30. Likewise, a step may be present in the surface of the semiconductor layer abutting the gate dielectric 30. Such protruding corners of conductive structures, i.e., the gate electrode 40 and the semiconductor layer 10, locally enhance the electrical field across the gate dielectric 30. The locally enhanced electric field across the portion of the gate dielectric 30 containing the boundary between gate dielectric portions of different thicknesses allow dielectric breakdown of the gate dielectric 30 at a less voltage bias across the gate electrode 40 and the semiconductor layer 10 than a gate dielectric having a constant thickness, e.g., the thickness of the second gate dielectric portion, across the entirety of the gate dielectric. Thus, the electrical antifuse of the present invention allows programming at a lower supply voltage than prior art electrical antifuses including a gate dielectric having a constant thickness.

The differences in the device characteristics are detected by a sensing circuit to determine the state of the electrical antifuse. Data is encoded in the electrical antifuse of the present invention by the presence or absence of alteration in the structure of the gate dielectric 30 accompanying the dielectric breakdown.

Figure 6A:
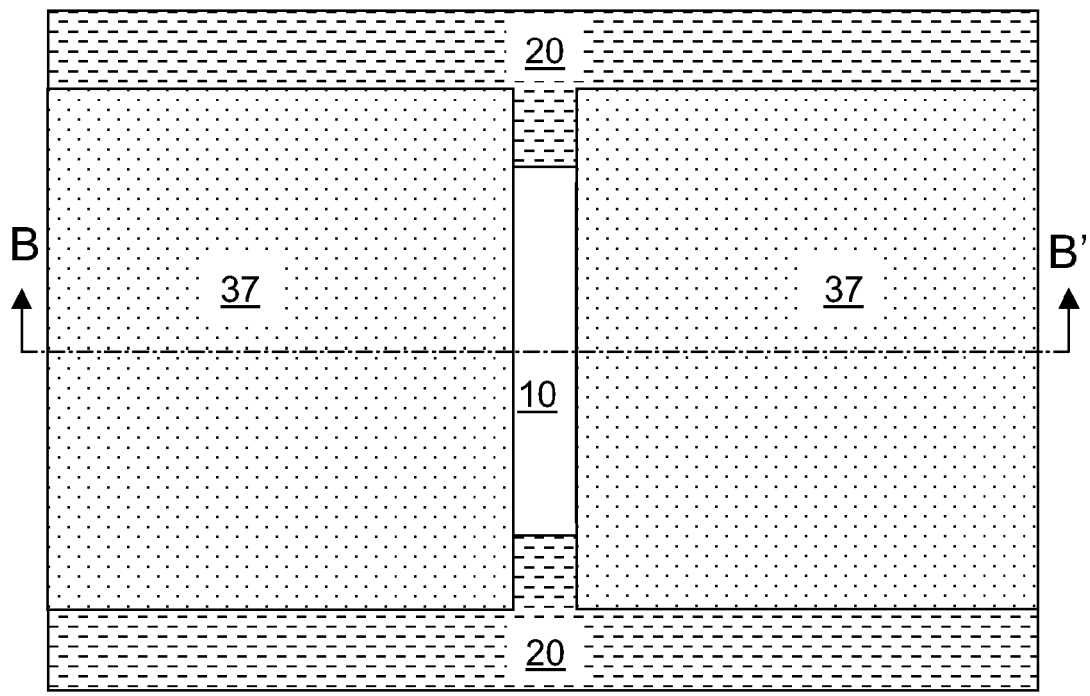
Figure 6B:
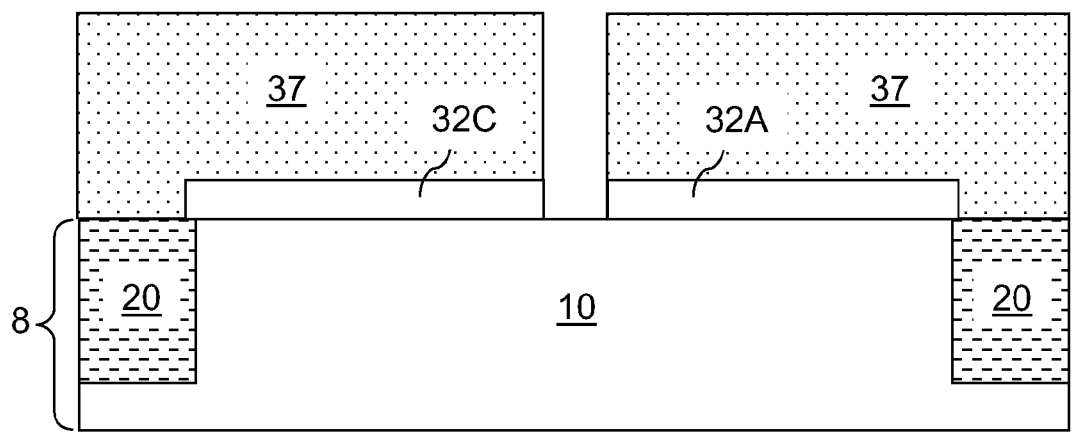

Referring to FIGS. 6A and 6B, a second exemplary semiconductor structure according to a second embodiment of the present invention is derived from the first exemplary semiconductor structure of FIGS. 1A and 1B. A photoresist 37 is applied over the gate dielectric layer 32L (See FIGS. 1A and 1B) and lithographically patterned to form a gap between two remaining portions of the photoresist 37.

Employing the remaining portion of the photoresist 37 as an etch mask, the exposed portion of the gate dielectric layer 32L is removed by an etch. The same etch process may be employed as in the first embodiment. One of the remaining portions of the gate dielectric layer 32L is herein referred to as a first gate dielectric portion 32A, and the other of the remaining portions of the gate dielectric layer 32L is herein referred to as a third gate dielectric portion 32C. The first gate dielectric portion 32A is separated from the third gate dielectric portion 32C. The first gate dielectric portion 32A and the third gate dielectric portion have the initial dielectric thickness t0, which is the thickness of the gate dielectric layer 32L (See FIG. 1B). The top surface of the active area comprising the semiconductor material of the semiconductor layer 10 is exposed between the first gate dielectric portion 32A and the third gate dielectric portion 32C. The photoresist 37 is subsequently removed. A suitable cleaning process may be performed on the exposed surface of the semiconductor layer 10.

Figure 7A:
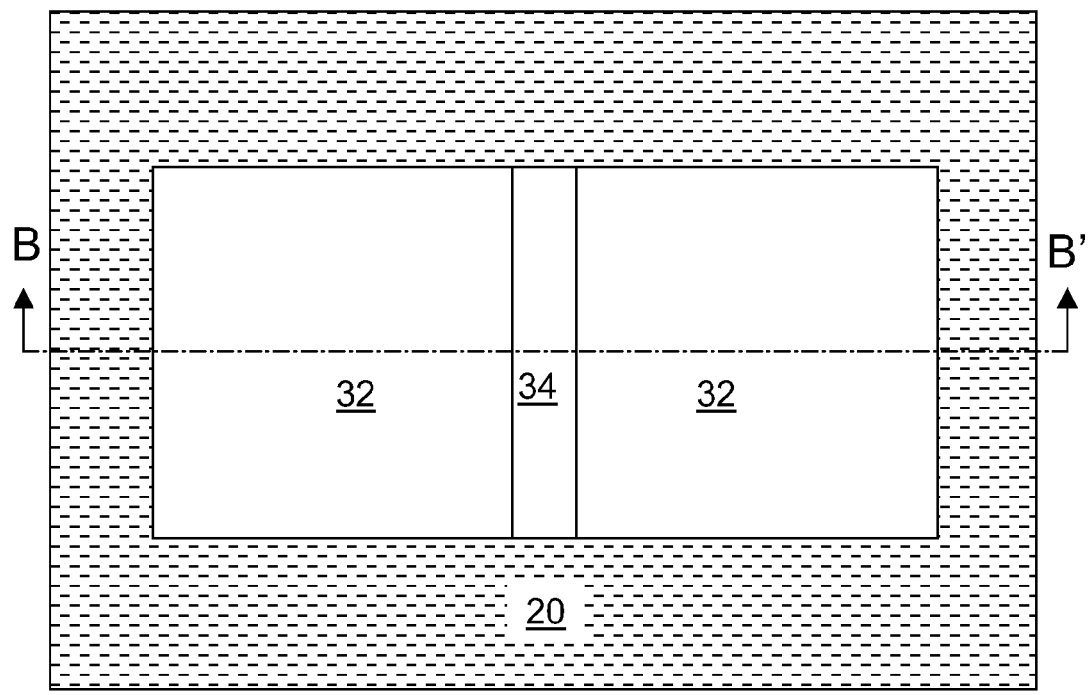
FIGS. 7A and 7B correspond to a step after formation of a second gate dielectric portion 34.
Figure 7B:
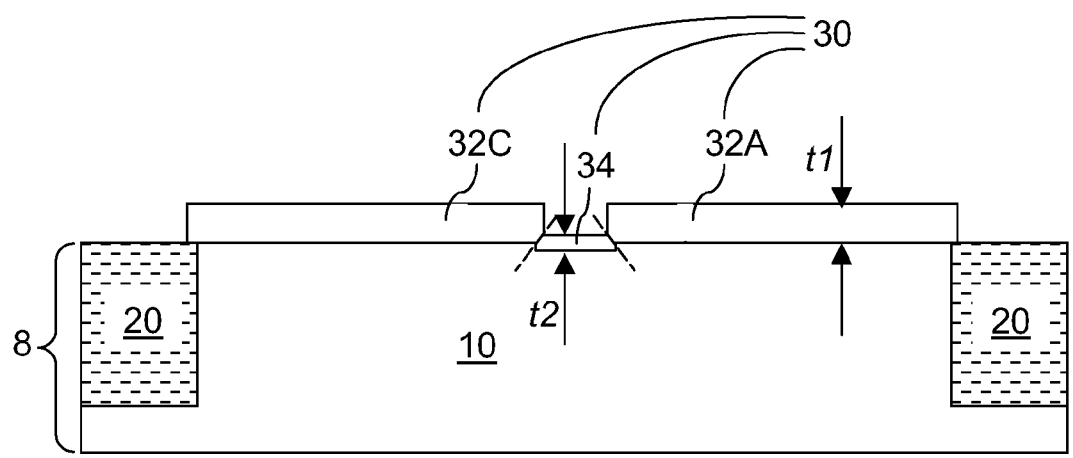

Referring to FIGS. 7A and 7B, a second gate dielectric portion 34 is formed on the exposed surface of the semiconductor layer 10. The second gate dielectric portion 34 is directly adjoined to, and laterally abuts, the first gate dielectric portion 32A and the third gate dielectric portion 32C. In one case, the second gate dielectric portion 34 may be formed by conversion of the semiconductor material in the exposed portion of the active area into a dielectric material by thermal oxidation, thermal nitridation, plasma oxidation, plasma nitridation, or a combination thereof as in the first embodiment. In this case, the first gate dielectric portion 32A and the third gate dielectric portion 32C have a first thickness t1, which may be substantially the same as the initial dielectric thickness t0 if a thickness increase of the first gate dielectric portion 32A and the third gate dielectric portion 32C is negligible during the formation of the second gate dielectric portion 34, or may be greater than the initial dielectric thickness t0 if the thickness the first gate dielectric portion 32A and the third gate dielectric portion 32C increases during the formation of the second gate dielectric portion 34.

In another case, the second gate dielectric portion 34 is formed by deposition of a high dielectric constant (high-k) material as in the first embodiment. In this case, the second gate dielectric portion 34 consists of the high-k dielectric material. Since the high-k dielectric material is added to the first gate dielectric portion 32A and the third gate dielectric portion 32C, the thickness of the first gate dielectric portion 32 increases from the initial dielectric thickness t0 by the thickness of the second gate dielectric portion 34. Each of the first gate dielectric portion 32A and the third gate dielectric portion 32C comprises the material of the gate dielectric layer 32L (See FIGS. 1A and 1B) and the material of the second gate dielectric portion 34. The second gate dielectric portion 34 has a second thickness t2, which is less than the first thickness t1.

The second thickness t2 may be from about 1 nm to about 3 nm, although lesser and greater thicknesses are contemplated herein. In one case, the first bottom surface, which is the bottom surface of the first gate dielectric portion 32A, and a third bottom surface, which is the bottom surface of the third gate dielectric portion 32C, may be vertically offset from, and located above the height of, the second bottom surface, which is the bottom surface of the second gate dielectric portion 34. In another case, the first bottom surface and the third bottom surface are substantially coplanar with the second bottom surface. The first gate dielectric portion 32A, the third gate dielectric portion 32C, and the second gate dielectric portion 34 collectively constitute a gate dielectric 30. The second gate dielectric portion 34 laterally abuts, and is directly joined to, the first gate dielectric portion 32A and the third gate dielectric portion 32C. The boundary between the second gate dielectric portion 34 and the first gate dielectric portion 32A may be a straight line or a curved line. Likewise, the boundary between the second gate dielectric portion 34 and the third gate dielectric portion 32C may be a straight line or a curved line.

Figure 8A:
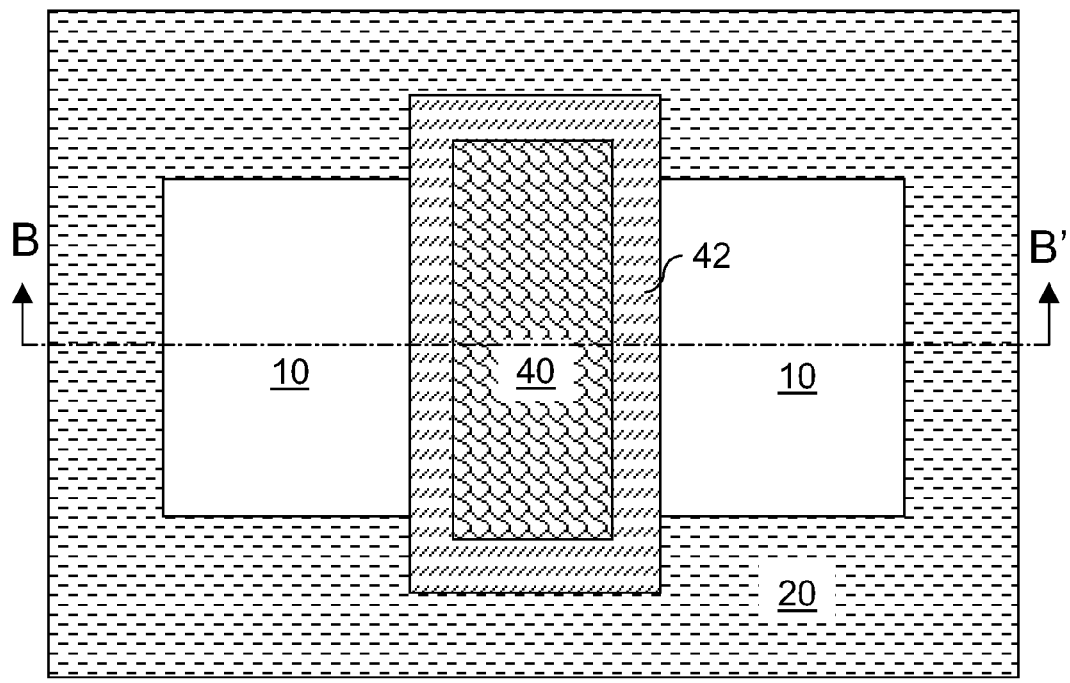
Figure 8B:
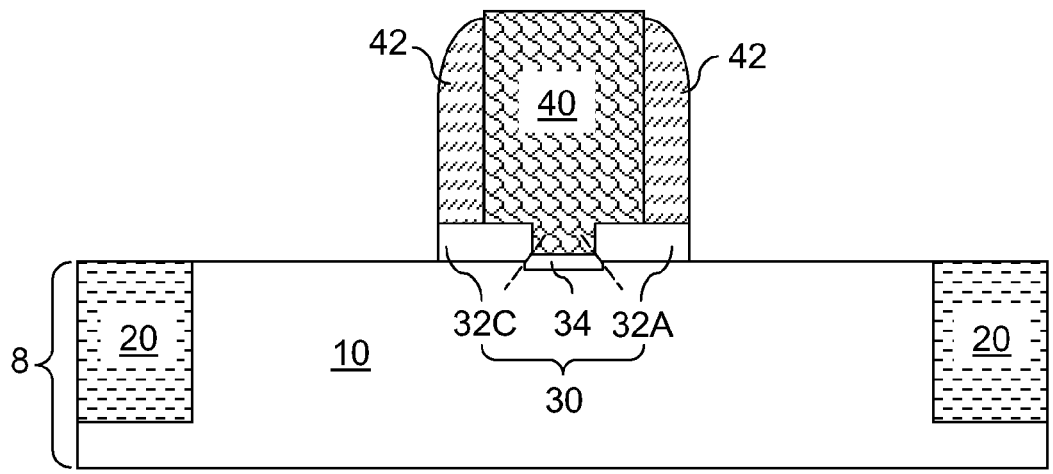

Referring to FIGS. 8A and 8B, a gate conductor layer (not shown) is formed over the gate dielectric 30 in the same manner as in the first embodiment. The gate conductor layer may comprise a semiconductor layer, a metal layer, a plurality of semiconductor layers, a plurality of metal layers, a stack of a semiconductor layer and a metal layer, or a combination thereof.

The gate conductor layer is lithographically patterned to form a gate electrode 40, which overlies the boundary between the first gate dielectric portion 32A and the second gate dielectric portion 34, which is herein referred to as a first boundary, and the boundary between the third gate dielectric portion 32C and the second gate dielectric portion 34, which is herein referred to as a second boundary. The gate electrode 40 straddles the first boundary and the second boundary. Thus, a sidewall of the gate electrode 40 is formed over the first gate dielectric portion 32A and another sidewall of the gate electrode 40 is formed over the third gate dielectric portion 32C. A first gate spacer 42 comprising a dielectric material is formed on the sidewalls of the gate electrode 40. The first gate spacer 42 may laterally surround the gate electrode 40. The first gate spacer 42 may be formed by deposition of a conformal dielectric layer followed by an anisotropic etch that removes horizontal portions of the conformal dielectric layer. The anisotropic etch may, or may not, be selective to the gate dielectric 30. In case the anisotropic etch is not selective to the gate dielectric 30, exposed portions of the gate dielectric 30 is removed so that the outer edge of the gate dielectric 30 is substantially vertically coincident with the outer sidewalls of the first gate spacer 42.

Figure 9A:
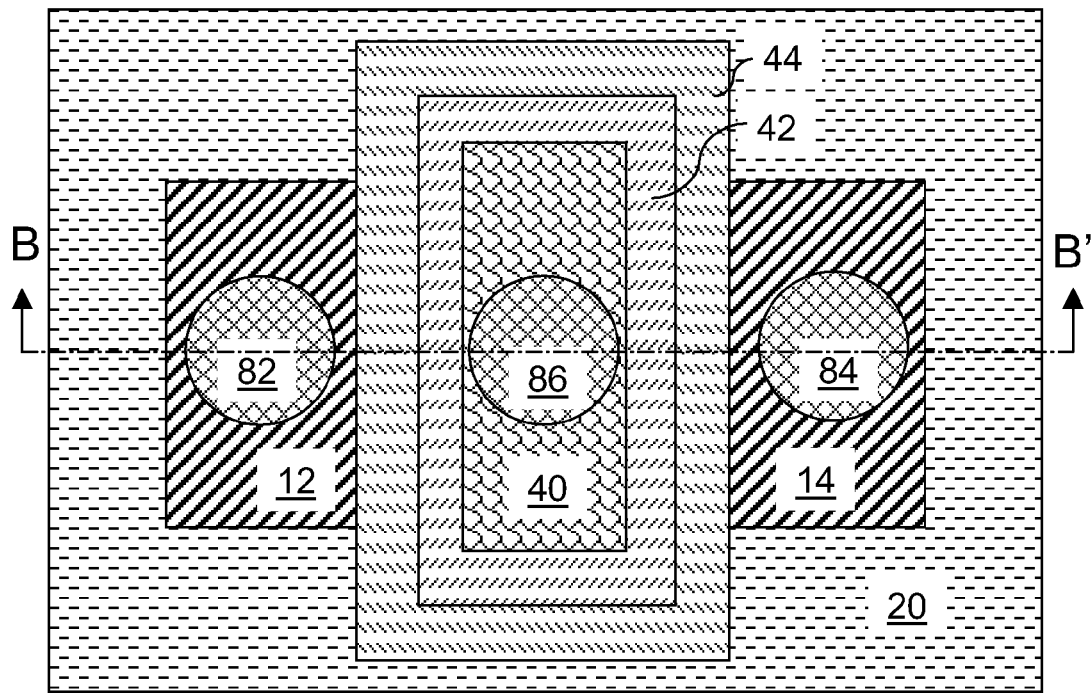
Figure 9B:
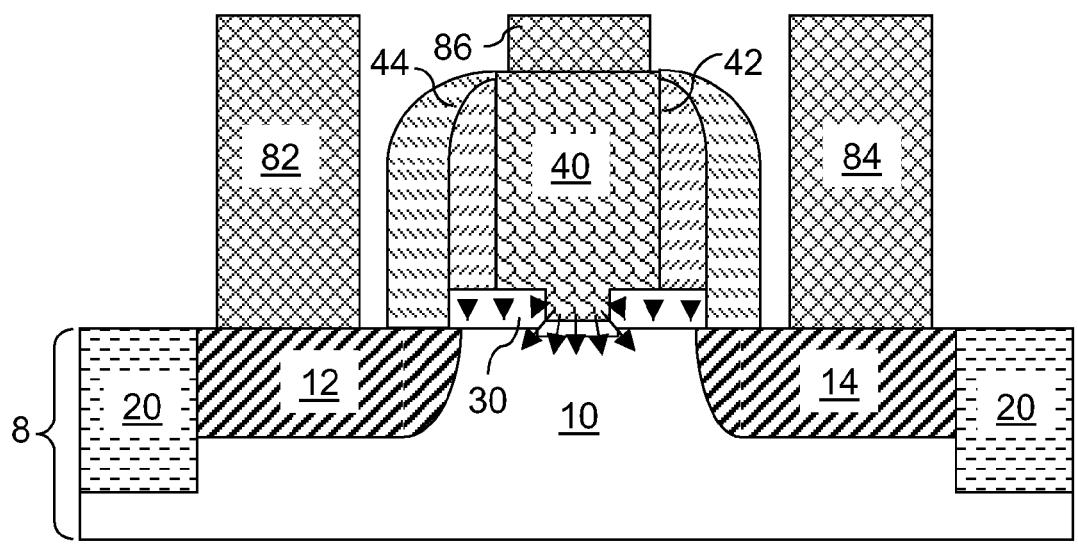

Referring to FIGS. 9A and 9B, a source region 12, a drain region 14, a second gate spacer 44 are formed in the same manner as in the first embodiment. The source region 12, the drain region 14, the gate dielectric 30, the gate electrode 40, and a channel collectively constitute a field effect transistor. The channel is a portion of the semiconductor layer 10 that abuts the bottom surface, i.e., the first bottom surface and the second bottom surface, of the gate dielectric 30. The field effect transistor is also an electrical antifuse that may be programmed by inducing a dielectric breakdown of the gate dielectric 30 upon application of a voltage bias between the channel and the gate electrode 40.

Metal semiconductor alloys such as metal silicides may be formed on the source region 12, the drain region 14, and the gate conductor 40. A middle-of-line (MOL) dielectric layer is formed in the same manner as in the first embodiment. Various contact via holes are formed in the MOL dielectric layer and filled with metal to from various contact vias. Specifically, a source contact via 82 is formed on the source region 12, a drain contact via 84 is formed on the drain region 14, and a gate contact via 86 is formed on the gate electrode 86. A first level metal wiring (not shown) may thereafter be formed, followed by formation of back-end-of-line (BEOL) structures.

The state of the electrical antifuse of the present invention may be detected by measuring the device characteristics of the field effect transistor. The same operational principle is used for the electrical antifuse of the second embodiment as for the electrical antifuse of the first embodiment.

The differences in the thickness of the first gate dielectric portion 32A and the third gate dielectric portion 32C and the thickness of the second gate dielectric portion 34 (See FIG. 8B) cause concentration of electric field at the first boundary and the second boundary. The step between the first gate dielectric portion 32A and the second gate dielectric portion 34 and the step between the third gate dielectric portion 32C and the second gate dielectric portion 34 in the gate dielectric 30 are necessarily accompanied by four corners of the gate conductor 40 that correspond to the bottom and the top of the steps in the gate dielectric 30. Likewise, two steps may be present in the surface of the semiconductor layer 10 abutting the gate dielectric 30. Such protruding corners of conductive structures, i.e., the gate electrode 40 and the semiconductor layer 10, locally enhance the electrical field across the gate dielectric 30 contribute to enhancement of the magnitude of the local electrical field at the first boundary and the second boundary. Thus, the electrical antifuse of the second embodiment allows programming at a lower supply voltage than prior art electrical antifuses including a gate dielectric having a constant thickness. The differences in the device characteristics are detected by a sensing circuit to determine the state of the electrical antifuse, thereby enabling of encoding data in the electrical antifuse in the same manner as in the first embodiment.

Figure 10A:
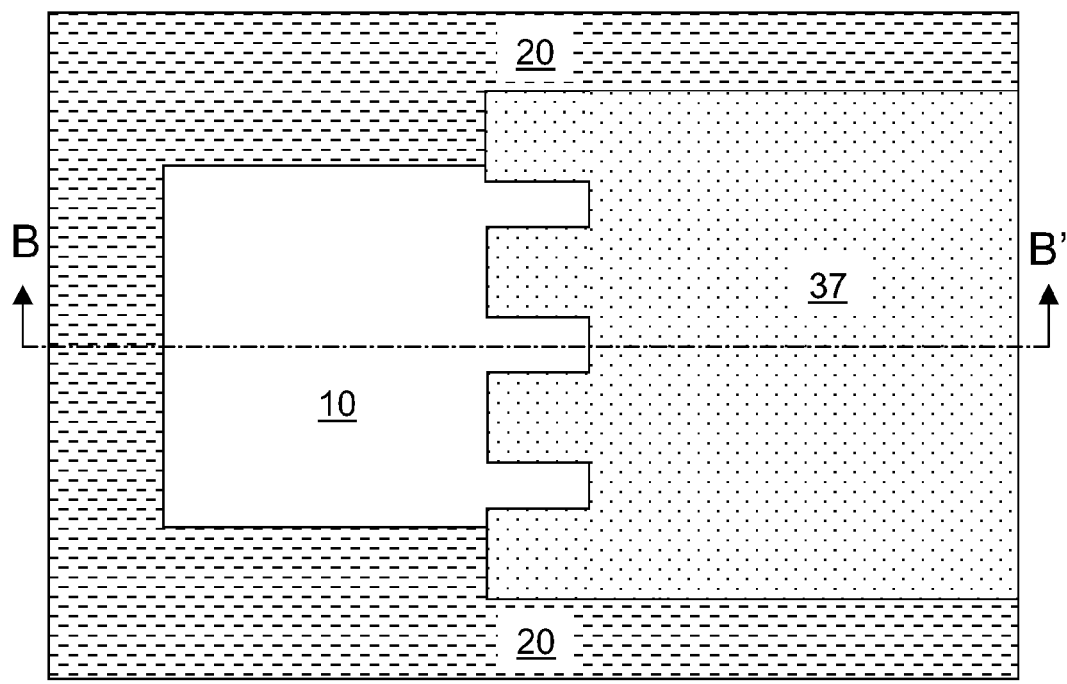
Figure 10B:
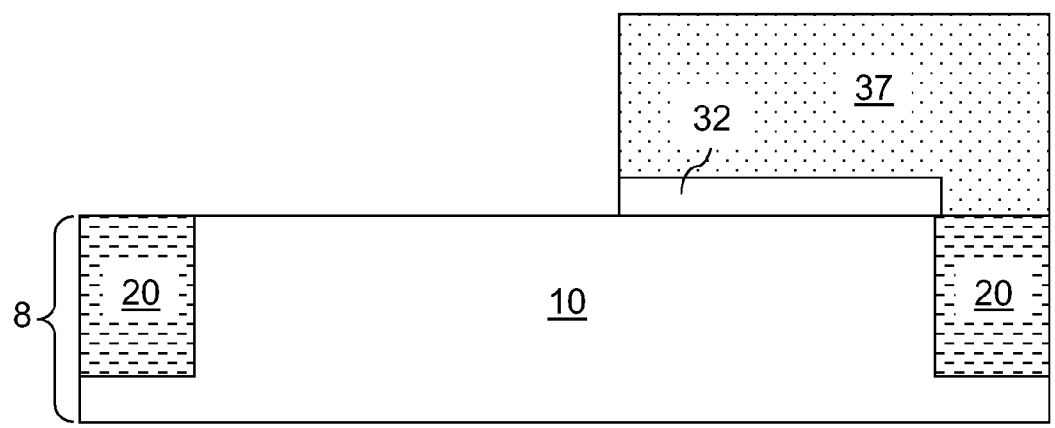

Referring to FIGS. 10A and 10B, a third exemplary semiconductor structure according to a third embodiment of the present invention is derived from the first exemplary semiconductor structure of FIGS. 1A and 1B. A photoresist 37 is applied over the gate dielectric layer 32L (See FIGS. 1A and 1B) and lithographically patterned. The pattern in the photoresist 37 is a serrated pattern, which may be a maze pattern including a set of parallel line segments. In general, the pattern in the photoresist 37 may be any pattern that increased the length of the edge of the photoresist 37 over the area of the gate dielectric layer 32L.

Employing the remaining portion of the photoresist 37 as an etch mask, the exposed portion of the gate dielectric layer 32L is removed by an etch. The same etch process may be employed as in the first embodiment. The remaining portions of the gate dielectric layer 32L is herein referred to as a first gate dielectric portion 32. The first gate dielectric portion 32 has the initial dielectric thickness t0, which the thickness of the gate dielectric layer 32L (See FIG. 1B). The top surface of the active area comprising the semiconductor material of the semiconductor layer 10 is exposed outside the area covered by the photoresist 37. The photoresist 37 is subsequently removed. A suitable cleaning process may be performed on the exposed surface of the semiconductor layer 10.

Figure 11A:
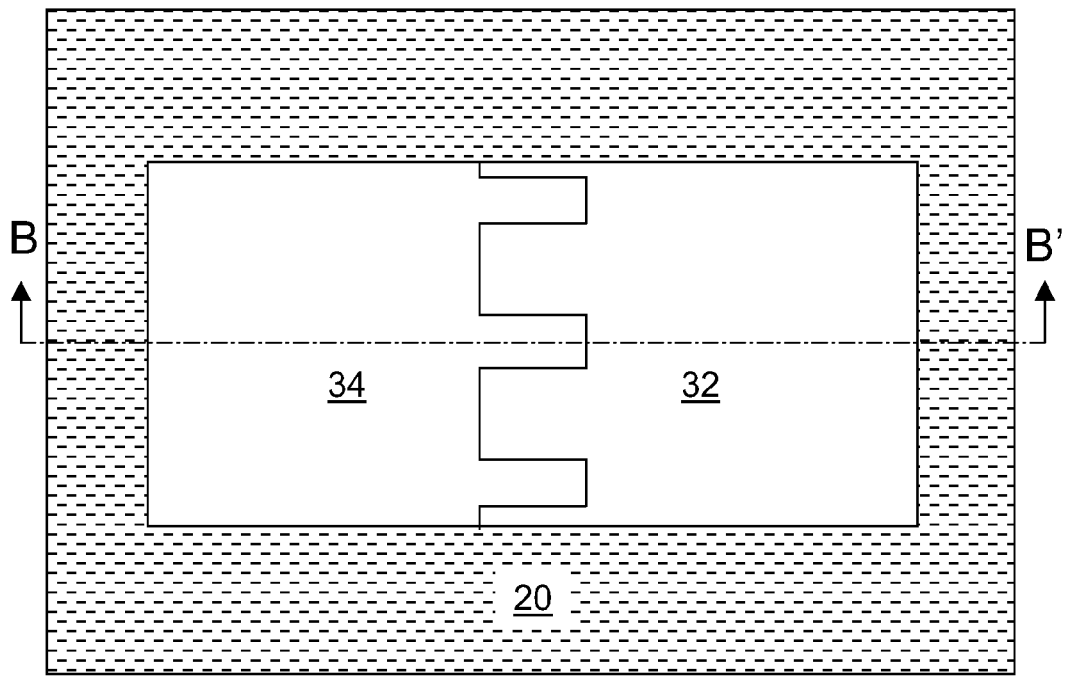
FIGS. 11A and 11B correspond to a step after formation of a second gate dielectric portion 34.
Figure 11B:
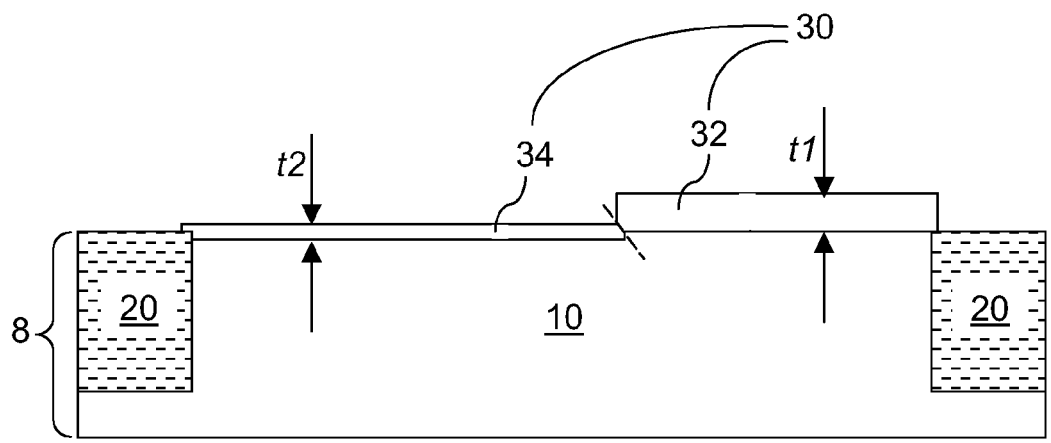

Referring to FIGS. 11A and 11B, a second gate dielectric portion 34 is formed on the exposed surface of the semiconductor layer 10. The second gate dielectric portion 34 is directly adjoined to, and laterally abuts, the first gate dielectric portion 32. In one case, the second gate dielectric portion 34 may be formed by conversion of the semiconductor material in the exposed portion of the active area into a dielectric material by thermal oxidation, thermal nitridation, plasma oxidation, plasma nitridation, or a combination thereof as in the first embodiment. In this case, the first gate dielectric portion 32 has a first thickness t1, which may be substantially the same as the initial dielectric thickness t0 if a thickness increase of the first gate dielectric portion 32 is negligible during the formation of the second gate dielectric portion 34, or may be greater than the initial dielectric thickness t0 if the thickness the first gate dielectric portion 32 increases during the formation of the second gate dielectric portion 34.

In another case, the second gate dielectric portion 34 is formed by deposition of a high dielectric constant (high-k) material as in the first embodiment. In this case, the second gate dielectric portion 34 consists of the high-k dielectric material. Since the high-k dielectric material is added to the first gate dielectric portion 32, the thickness of the first gate dielectric portion 32 increases from the initial dielectric thickness t0 by the thickness of the second gate dielectric portion 34. The first gate dielectric portion 32 comprises the material of the gate dielectric layer 32L (See FIGS. 1A and 1B) and the material of the second gate dielectric portion 34. The second gate dielectric portion 34 has a second thickness t2, which is less than the first thickness t1.

The second thickness t2 may be from about 1 nm to about 3 nm, although lesser and greater thicknesses are contemplated herein. In one case, the first bottom surface, which is the bottom surface of the first gate dielectric portion 32 may be vertically offset from, and located above the height of, the second bottom surface, which is the bottom surface of the second gate dielectric portion 34. In another case, the first bottom surface is substantially coplanar with the second bottom surface. The first gate dielectric portion 32 and the second gate dielectric portion 34 collectively constitute a gate dielectric 30. The second gate dielectric portion 34 laterally abuts, and is directly joined to, the first gate dielectric portion 32. The boundary between the first gate dielectric portion 32 and the second gate dielectric portion 34 comprises a maze pattern including a set of parallel line segments. The boundary underlies the gate electrode 40.

Figure 12A:
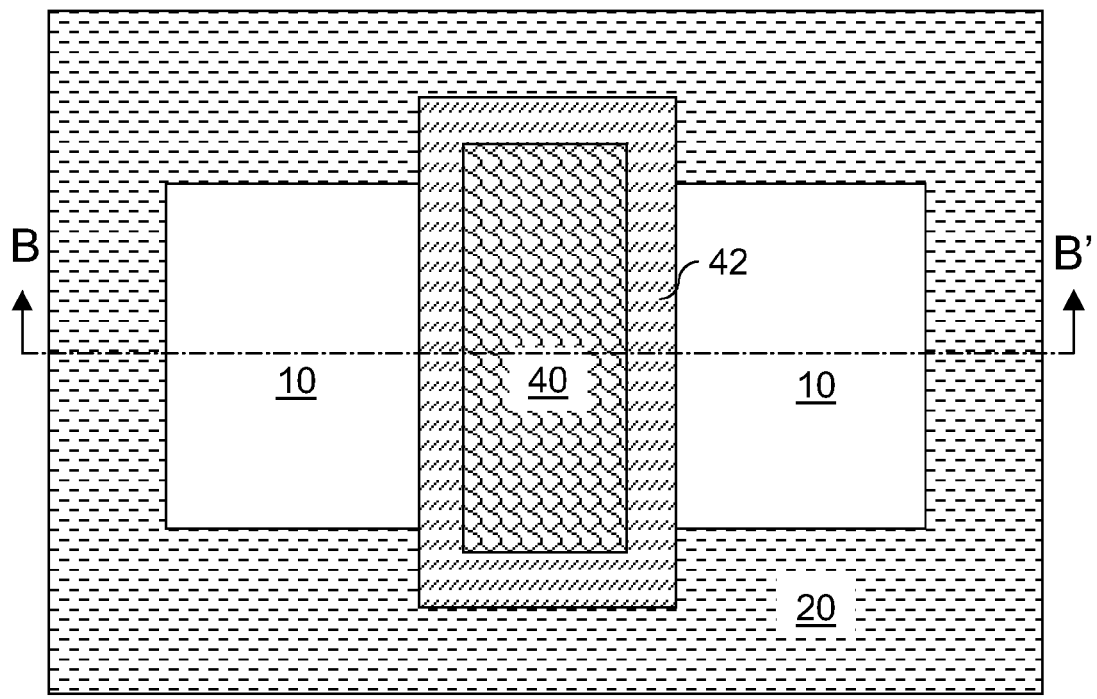
Figure 12B:
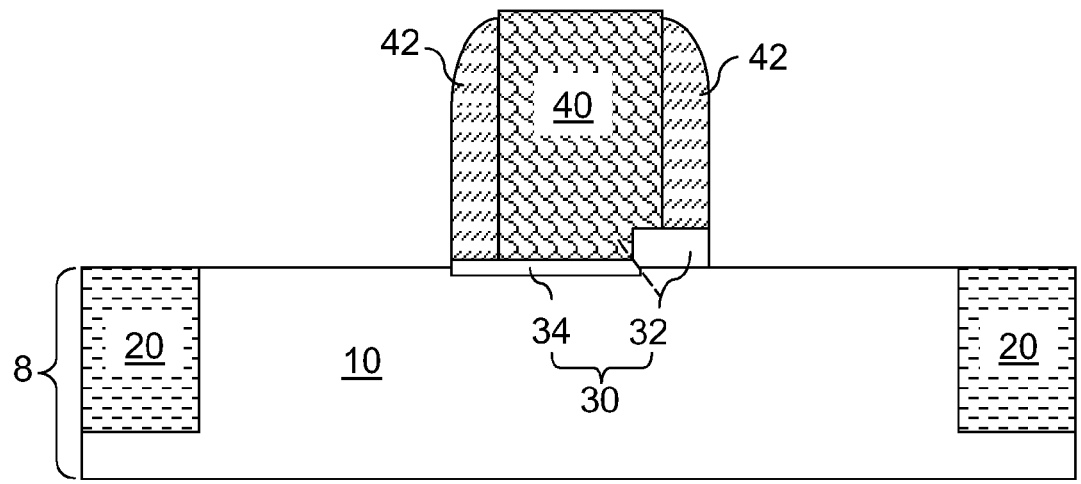

Referring to FIGS. 12A and 12B, a gate conductor layer (not shown) is formed over the gate dielectric 30 in the same manner as in the first embodiment. The gate conductor layer may comprise a semiconductor layer, a metal layer, a plurality of semiconductor layers, a plurality of metal layers, a stack of a semiconductor layer and a metal layer, or a combination thereof.

The gate conductor layer is lithographically patterned to form a gate electrode 40, which overlies the entirety of the boundary between the first gate dielectric portion 32 and the second gate dielectric portion 34. Since the gate electrode 40 straddles the boundary, a sidewall of the gate electrode 40 is formed over the first gate dielectric portion 32, and another sidewall of the gate electrode 40 is formed over the second gate dielectric portion 34. A first gate spacer 42 comprising a dielectric material is formed on the sidewalls of the gate electrode 40. The first gate spacer 42 may laterally surround the gate electrode 40. The first gate spacer 42 is formed in the same manner as in the first embodiment.

Figure 13A:
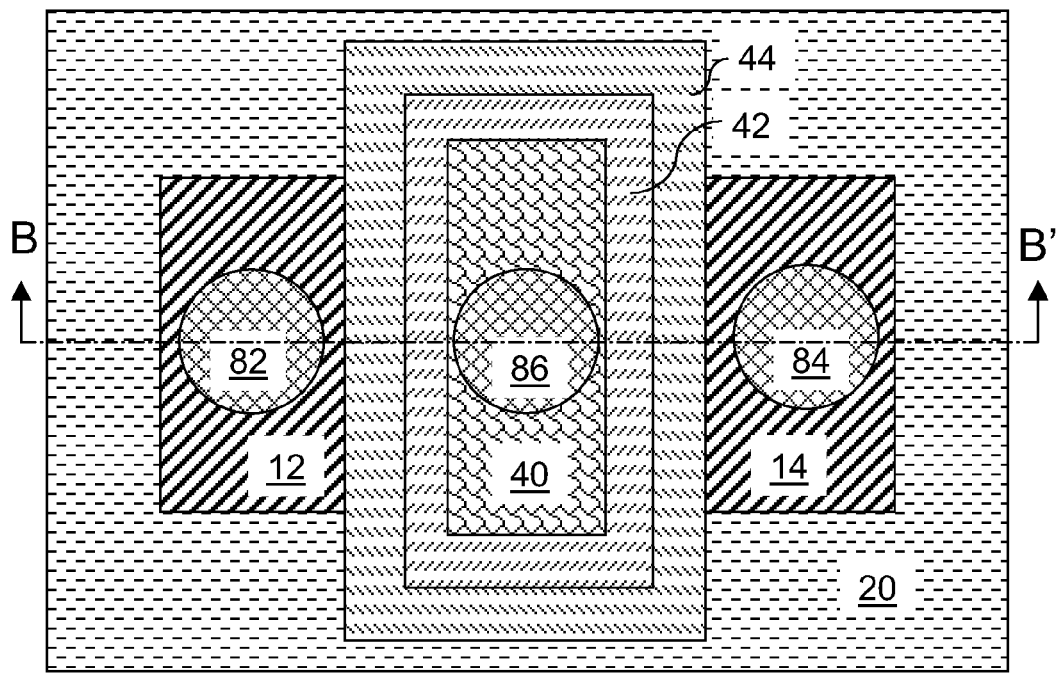
Figure 13B:
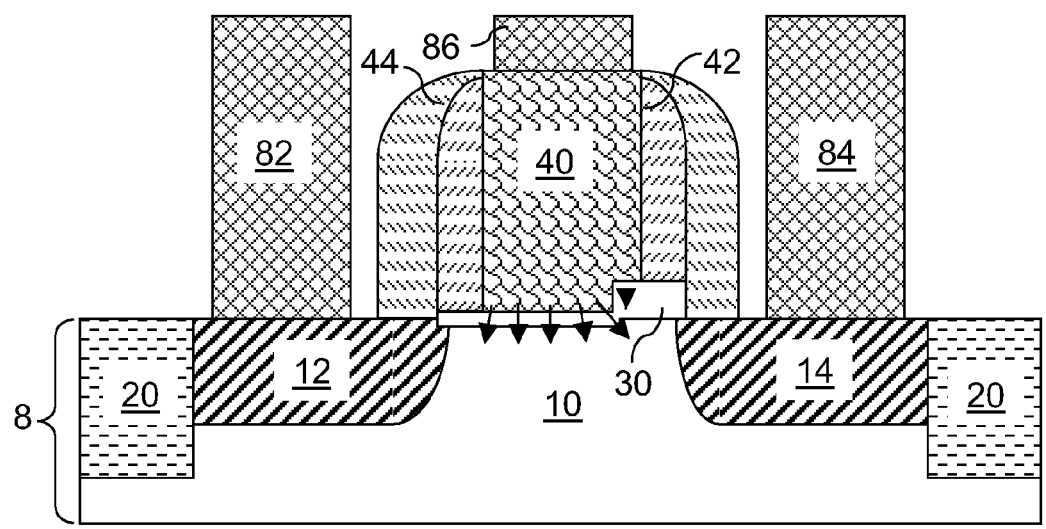

Referring to FIGS. 13A and 13B, a source region 12, a drain region 14, a second gate spacer 44 are formed in the same manner as in the first embodiment. The source region 12, the drain region 14, the gate dielectric 30, the gate electrode 40, and a channel collectively constitute a field effect transistor. The channel is a portion of the semiconductor layer 10 that abuts the bottom surface, i.e., the first bottom surface and the second bottom surface, of the gate dielectric 30. The field effect transistor is also an electrical antifuse that may be programmed by inducing a dielectric breakdown of the gate dielectric 30 upon application of a voltage bias between the channel and the gate electrode 40.

Metal semiconductor alloys such as metal silicides may be formed on the source region 12, the drain region 14, and the gate conductor 40. A middle-of-line (MOL) dielectric layer is formed in the same manner as in the first and second embodiments. Various contact via holes are formed in the MOL dielectric layer and filled with metal to from various contact vias as in the first and second embodiments.

The state of the electrical antifuse of the present invention may be detected by measuring the device characteristics of the field effect transistor. The same operational principle is used for the electrical antifuse of the second embodiment as for the electrical antifuse of the first embodiment.

The difference in the thickness of the first gate dielectric portion 32 and the thickness of the second gate dielectric portion 34 (See FIGS. 11A and 11B) causes concentration of electric field at the first boundary and the second boundary. Further, the maze pattern in the boundary between the first gate dielectric portion 32 and the second gate dielectric portion 34 (See FIGS. 11A and 11B) increases the volume of the gate dielectric 30 in which the local electric field is enhanced by the geometry of the gate electrode 40 and the semiconductor layer 10. The step between the first gate dielectric portion 32 and the second gate dielectric portion 34 in the gate dielectric 30 are necessarily accompanied by two corners of the gate conductor 40 that correspond to the bottom and the top of the steps in the gate dielectric 30. Likewise, two steps may be present in the surface of the semiconductor layer 10 abutting the gate dielectric 30. Such protruding corners of conductive structures, i.e., the gate electrode 40 and the semiconductor layer 10, locally enhance the electrical field across the gate dielectric 30 contribute to enhancement of the magnitude of the local electrical field at the boundary. Thus, the electrical antifuse of the third embodiment allows programming at a lower supply voltage than prior art electrical antifuses including a gate dielectric having a constant thickness. The differences in the device characteristics are detected by a sensing circuit to determine the state of the electrical antifuse, thereby enabling of encoding data in the electrical antifuse in the same manner as in the first and second embodiments.

While the invention has been described in terms of specific embodiments, it is evident in view of the foregoing description that numerous alternatives, modifications and variations will be apparent to those skilled in the art. Accordingly, the invention is intended to encompass all such alternatives, modifications and variations which fall within the scope and spirit of the invention and the following claims.

What is claimed is:

1. A semiconductor structure comprising:
a gate dielectric located on a semiconductor layer and comprising a first gate dielectric portion, a second gate dielectric portion laterally abutting said first gate dielectric portion,
and a third gate dielectric portion laterally abutting said second gate dielectric portion and spaced from said first gate dielectric portion by said first gate dielectric portion, wherein said first gate dielectric portion has a first horizontal top surface and a first horizontal bottom surface
separated by a constant distance of a first thickness, said second gate dielectric portion has a second horizontal top surface and a second horizontal bottom surface separated by another constant distance of a second thickness, said third gate dielectric portion has a third horizontal top surface and a third horizontal bottom surface separated by a constant distance of a third thickness, and said first thickness is greater than said second thickness and said third thickness is greater than said second thickness;
a gate electrode vertically abutting said first horizontal top surface of said first gate dielectric portion and said second horizontal top surface of said second gate dielectric portion;
a source region directly contacting an edge of said first gate dielectric portion; and
a drain region directly contacting an edge of said third gate dielectric portion;
wherein said first horizontal bottom surface of said second gate dielectric portion is vertically offset and lower within the substrate from said horizontal bottom portion of said first and third gate dielectric portions and the said first and third gate dielectric portions have horizontal bottom surfaces on the major plane of the semiconductor substrate.

2. The semiconductor structure of claim 1, wherein said gate electrode comprises a sidewall directly adjoining said first horizontal top surface of said first gate dielectric portion and another sidewall directly adjoining said third horizontal top surface of said third gate dielectric portion.

3. The semiconductor structure of claim 2, wherein a boundary between said first gate dielectric portion and said second gate dielectric portion is a straight line.

4. The semiconductor structure of claim 1, wherein said gate electrode comprises one sidewall directly adjoining said first horizontal top surface of said first gate dielectric portion and another sidewall directly adjoining a third horizontal top surface of said third gate dielectric portion.

5. The semiconductor structure of claim 1, further comprising:
a source contact via contacting said source region;
a drain contact via contacting said drain region; and
a gate contact via contacting said gate electrode.

6. A semiconductor structure comprising:
a gate dielectric located on a semiconductor layer and comprising a first gate dielectric portion and a second gate dielectric portion laterally abutting said first gate dielectric portion, said first gate dielectric portion has a first horizontal top surface and a first horizontal bottom surface separated by a constant distance of a first thickness, and said second gate dielectric portion has a second horizontal top surface and a second horizontal bottom surface separated by another constant distance of a second thickness, wherein a boundary between said first gate dielectric portion and said second gate dielectric portion comprises a maze pattern in plan view including a set of parallel line segments underlying said gate electrode, said gate dielectric having said first horizontal bottom surface directly on one side of said boundary and having said second horizontal bottom surface directly on the other side of said boundary, and said first thickness is greater than said second thickness; and a gate electrode vertically abutting said first horizontal top surface of said first gate dielectric portion and said second horizontal top surface of said second gate dielectric portion.

7. The semiconductor structure of claim 6, wherein said gate electrode comprises a sidewall directly adjoining said first horizontal top surface of said first gate dielectric portion and another sidewall directly adjoining said second horizontal top surface of said second gate dielectric portion.

8. The semiconductor structure of claim 6, wherein said gate electrode comprises one sidewall directly adjoining said first horizontal top surface of said first gate dielectric portion and another sidewall directly adjoining said second horizontal top surface of said second gate dielectric portion.

9. The semiconductor structure of claim 6, wherein said first horizontal bottom surface of said first gate dielectric portion is vertically offset from said second horizontal bottom portion of said second gate dielectric portion.

10. The semiconductor structure of claim 6, further comprising:
   a source region directly contacting an edge of said first gate dielectric portion; and
   a drain region directly contacting an edge of said second gate dielectric portion.

11. The semiconductor structure of claim 6, further comprising:
   a source region directly contacting an edge of said gate dielectric;
   a drain region directly contacting another edge of said gate dielectric;
   a source contact via contacting said source region;
   a drain contact via contacting said drain region; and
   a gate contact via contacting said gate electrode.

12. The semiconductor structure of claim 1, wherein said third thickness is the same as said first thickness.

* * * * *